US010763362B2

(12) United States Patent
Chang et al.

(10) Patent No.: US 10,763,362 B2
(45) Date of Patent: Sep. 1, 2020

(54) FIN FIELD EFFECT TRANSISTOR (FINFET) DEVICE STRUCTURE WITH STOP LAYER AND METHOD FOR FORMING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 16/050,703

(22) Filed: Jul. 31, 2018

(65) Prior Publication Data
US 2018/0337279 A1 Nov. 22, 2018

Related U.S. Application Data

(62) Division of application No. 14/792,303, filed on Jul. 6, 2015, now Pat. No. 10,084,085.

(60) Provisional application No. 62/174,236, filed on Jun. 11, 2015.

(51) Int. Cl.
*H01L 29/78* (2006.01)
*H01L 21/8234* (2006.01)
*H01L 21/28* (2006.01)
*H01L 21/283* (2006.01)
*H01L 29/06* (2006.01)
(Continued)

(52) U.S. Cl.
CPC ........ *H01L 29/7845* (2013.01); *H01L 21/283* (2013.01); *H01L 21/28008* (2013.01); *H01L 21/823431* (2013.01); *H01L 29/0649* (2013.01); *H01L 29/4236* (2013.01); *H01L 29/66545* (2013.01); *H01L 29/66795* (2013.01); *H01L 29/785* (2013.01); *H01L 29/7848* (2013.01); *H01L 29/7849* (2013.01)

(58) Field of Classification Search
None
See application file for complete search history.

(56) References Cited

U.S. PATENT DOCUMENTS

| 6,693,335 | B2 | 2/2004 | Gonzalez et al. |
| 6,706,571 | B1 | 3/2004 | Yu et al. |
| 6,858,478 | B2 | 2/2005 | Chau et al. |

(Continued)

FOREIGN PATENT DOCUMENTS

| JP | 2009-071294 A | 4/2009 |
| KR | 20130120973 | 11/2013 |
| WO | WO-2014-142952 A1 | 9/2014 |

OTHER PUBLICATIONS

Korean Intellectual Property Office, Office Action dated Aug. 17, 2016 for application No. 10-20185-0128769, 14 pps.

*Primary Examiner* — Steven B Gauthier
(74) *Attorney, Agent, or Firm* — Haynes and Boone, LLP

(57) ABSTRACT

A FinFET device structure and method for forming the same are provided. The Fin PET device structure includes a stop layer formed over a substrate and a fin structure formed over the stop layer. The FinFET device structure includes a gate structure formed over the fin structure and a source/drain (S/D) structure adjacent to the gate structure. A bottom surface of the S/D structure is located at a position that is higher than or level with a bottom surface of the stop layer.

20 Claims, 32 Drawing Sheets

(51) Int. Cl.
*H01L 29/423* (2006.01)
*H01L 29/66* (2006.01)

(56) References Cited

U.S. PATENT DOCUMENTS

| | | | |
|---|---|---|---|
| 6,998,676 B2 | 2/2006 | Kondo et al. |
| 7,015,078 B1 | 3/2006 | Xiang et al. |
| 7,015,547 B2 | 3/2006 | Hackler et al. |
| 7,019,342 B2 | 3/2006 | Hackler et al. |
| 7,056,781 B2 | 6/2006 | Yoon |
| 7,105,897 B2 | 9/2006 | Chen et al. |
| 7,190,050 B2 | 3/2007 | King et al. |
| 7,247,887 B2 | 7/2007 | King et al. |
| 7,265,008 B2 | 9/2007 | King et al. |
| 7,300,837 B2 | 11/2007 | Chen et al. |
| 7,309,634 B2 | 12/2007 | Hong et al. |
| 7,323,389 B2 | 1/2008 | Goktepeli et al. |
| 7,402,875 B2 | 7/2008 | Datta et al. |
| 7,411,822 B2 | 8/2008 | Specht et al. |
| 7,453,124 B2 | 11/2008 | Adan et al. |
| 7,473,605 B2 | 1/2009 | Anderson et al. |
| 7,473,964 B2 | 1/2009 | Izumida et al. |
| 7,508,031 B2 | 3/2009 | Liu et al. |
| 7,528,465 B2 | 5/2009 | King et al. |
| 7,605,449 B2 | 10/2009 | Liu et al. |
| 7,656,183 B2 | 2/2010 | Hsu et al. |
| 7,714,384 B2 | 5/2010 | Seliskar et al. |
| 7,719,043 B2 | 5/2010 | Yamagami et al. |
| 7,777,275 B2 | 8/2010 | Lee et al. |
| 7,745,871 B2 | 9/2010 | Oh et al. |
| 7,799,592 B2 | 9/2010 | Lochtefeld et al. |
| 7,807,523 B2 | 10/2010 | Liu et al. |
| 7,838,373 B2 | 11/2010 | Giles et al. |
| 7,863,122 B2 | 1/2011 | Booth et al. |
| 7,906,814 B2 | 3/2011 | Lee et al. |
| 7,915,693 B2 | 3/2011 | Okano et al. |
| 7,939,862 B2 | 5/2011 | Moroz et al. |
| 7,960,232 B2 | 6/2011 | King et al. |
| 8,106,381 B2 | 1/2012 | Atanackovic et al. |
| 8,114,746 B2 | 2/2012 | Wei et al. |
| 8,171,073 B2 | 5/2012 | Lee et al. |
| 8,183,627 B2 | 5/2012 | Currie et al. |
| 8,294,211 B2 | 10/2012 | Yang et al. |
| 8,466,490 B2 | 6/2013 | Liu et al. |
| 8,476,711 B2 | 7/2013 | Gossner et al. |
| 8,530,971 B2 | 9/2013 | Cheng et al. |
| 8,679,924 B2 | 3/2014 | Wei et al. |
| 8,748,940 B1 | 6/2014 | Rachmady et al. |
| 8,786,057 B2 | 7/2014 | King et al. |
| 8,815,691 B2 | 8/2014 | Colinge et al. |
| 8,927,377 B2 | 1/2015 | Xu et al. |
| 9,171,925 B2 | 10/2015 | Kuo et al. |
| 9,722,079 B2 | 8/2017 | Chang et al. |
| 2004/0266077 A1 | 12/2004 | Yeo et al. |
| 2005/0272190 A1 | 12/2005 | Lee et al. |
| 2006/0060941 A1 | 3/2006 | Sun et al. |
| 2006/0091490 A1 | 5/2006 | Chen et al. |
| 2008/0001171 A1 | 1/2008 | Tezuka et al. |
| 2009/0121288 A1 | 5/2009 | Patruno |
| 2010/0207209 A1 | 8/2010 | Inokuma et al. |
| 2010/0308440 A1 | 12/2010 | Johnson et al. |
| 2011/0171805 A1 | 7/2011 | Yu et al. |
| 2011/0193175 A1 | 8/2011 | Huang et al. |
| 2012/0074464 A1 | 3/2012 | Cea et al. |
| 2012/0091528 A1 | 4/2012 | Chang et al. |
| 2013/0234204 A1 | 9/2013 | Kang et al. |
| 2014/0264280 A1* | 9/2014 | Kim .............. H01L 29/785 257/29 |
| 2014/0285980 A1 | 9/2014 | Cappellani et al. |
| 2015/0076514 A1 | 3/2015 | Morin et al. |
| 2015/0137263 A1* | 5/2015 | Lee .............. H01L 29/785 257/401 |
| 2015/0325699 A1* | 11/2015 | Zhu .............. H01L 29/7845 257/192 |
| 2016/0005864 A1* | 1/2016 | Kwon ............ H01L 29/7848 257/190 |
| 2017/0358678 A1 | 12/2017 | Chang et al. |

\* cited by examiner

FIN FIELD EFFECT TRANSISTOR (FINFET) DEVICE STRUCTURE WITH STOP LAYER AND METHOD FOR FORMING THE SAME

PRIORITY CLAIM AND CROSS-REFERENCE

This Application is a divisional application of U.S. patent application Ser. No. 14/795,303, filed Jul. 6, 2015, which claims the benefit of U.S. Provisional Application No. 62/174,236, filed on Jun. 11, 2015, and entitled "FIN FIELD EFFECT TRANSISTOR (FINFET) DEVICE STRUCTURE WITH STOP LAYER AND METHOD FOR FORMING THE SAME", each of which are incorporated by reference in their entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
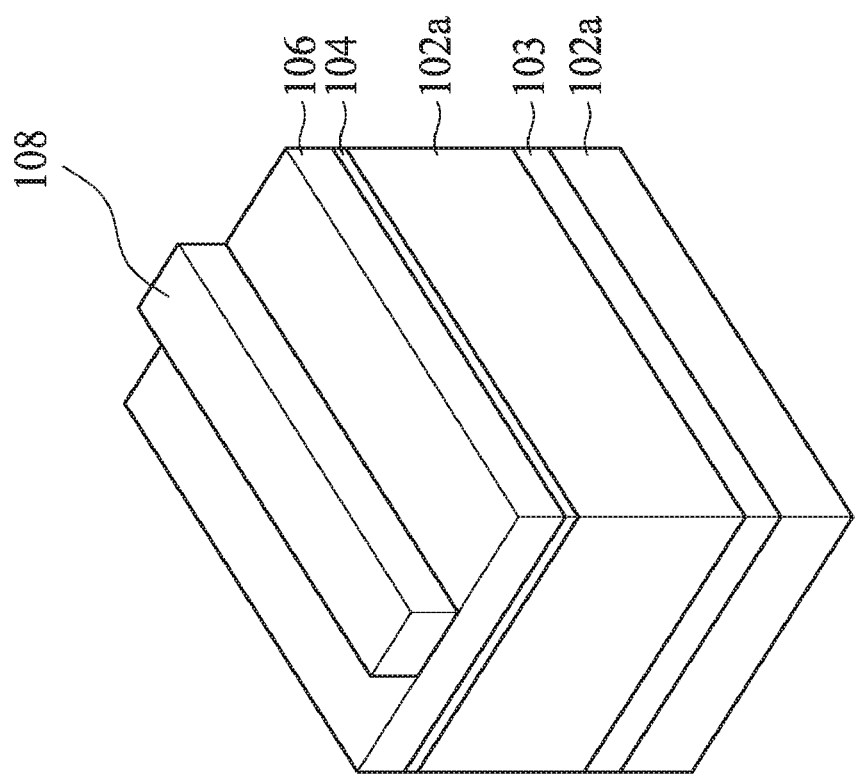
FIGS. 1A-1J show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a fin field effect transistor (FinFET) device structure are provided. FIGS. 1A-1J show perspective representations of various stages of forming a FinFET device structure 100a, in accordance with some embodiments of the disclosure.

Referring to FIG. 1A, a first substrate 102a is provided. The first substrate 102a may be made of silicon or another semiconductor material. Alternatively or additionally, the first substrate 102a may include other elementary semiconductor materials such as germanium. In some embodiments, the first substrate 102a is made of a compound semiconductor such as silicon carbide, gallium arsenic, indium arsenide, or indium phosphide. In some embodiments, the first substrate 102a is made of an alloy semiconductor such as silicon germanium, silicon germanium carbide, gallium arsenic phosphide, or gallium indium phosphide. In some embodiments, the first substrate 102a includes an epitaxial layer. For example, the first substrate 102a has an epitaxial layer overlying a bulk semiconductor.

Afterwards, a stop layer 103 is formed on the first substrate 102. The stop layer 103 is used as an etching stop layer in the subsequent process. In some embodiments, the stop layer 103 is made of SiGeOx, SiGe, SiO, SiP, SiPOx and combinations thereof. In some embodiments, the stop layer 103 is formed by performing an ion implant process on the first substrate 102a. In some embodiments, the stop layer 103 is formed by performing a deposition process over the first substrate 102a, such as an atomic layer deposition (ALD) process, a chemical vapor deposition (CVD) process, a physical vapor deposition (PVD) process, or another applicable process. When the stop layer 103 is formed by the ALD process, the quality of the stop layer 103 is good.

Afterwards, a second substrate 102b is formed over the stop layer 103. In other words, the stop layer 103 is disposed between the first substrate 102a and the second substrate 102b. The second substrate 102b may be made of silicon or another semiconductor material. The first substrate 102a and the second substrate 102b may be made of the same or different materials. The lattice constant of the stop layer 103 is different from that of the first substrate 102a.

In some embodiments, the stop layer 103 and the first substrate 102a are made of different materials, and the stop layer 103 and the second substrate 102b are made of different materials. More specifically, the first substrate 102a, the stop layer 103 and the second substrate 102b are made of three different materials. In some other embodiments, the first substrate 102a and the second substrate 102b are made of the same material, and the stop layer 103 and the first substrate are made of different materials.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

The dielectric layer 104 is a buffer layer between the second substrate 102b and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
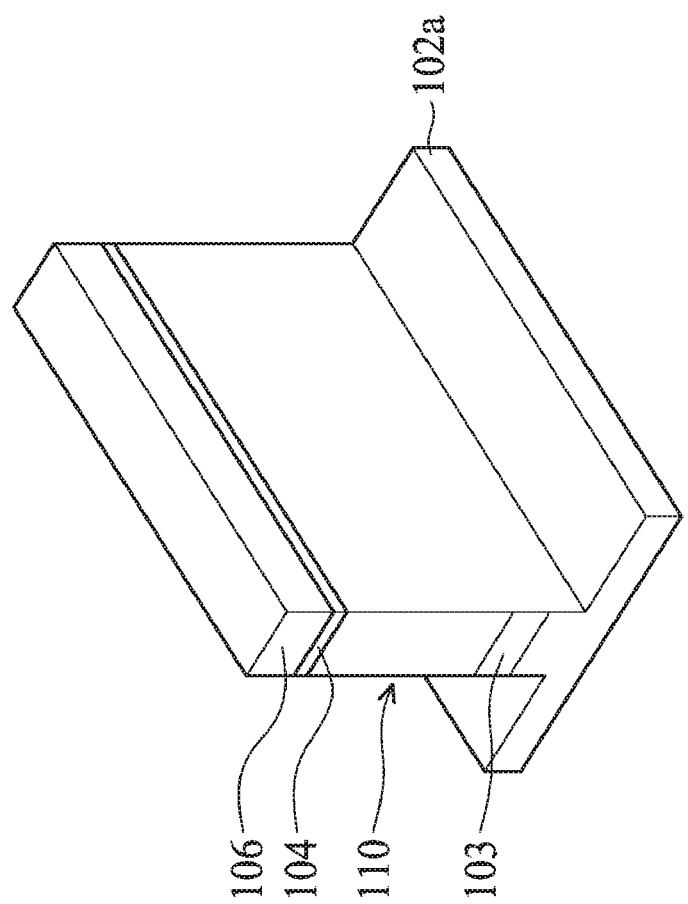

After the photoresist layer 108 is patterned, the dielectric layer 104 and the mask layer 106 are patterned by using the patterned photoresist layer 108 as a mask as shown in FIG. 1B, in accordance with some embodiments. As a result, a patterned pad layer 104 and a patterned mask layer 106 are obtained. Afterwards, the patterned photoresist layer 108 is removed.

Afterwards, an etching process is performed on the substrate 102 to form a fin structure 110 by using the patterned dielectric layer 104 and the patterned mask layer 106 as a mask. The etching process may be a dry etching process or a wet etching process. It should be noted that the stop layer 103 is also pattered, and the sidewalls of the stop layer 103 is exposed. More specifically, the fin structure 110 is formed over the stop layer 103. The stop layer 103 is formed between the first substrate 102a and the fin structure 110.

In some embodiments, the substrate 102 is etched by a dry etching process. The dry etching process includes using the fluorine-based etchant gas, such as $SF_6$, $C_xF_y$, $NF_3$ or combinations thereof. The etching process may be a time-controlled process, and continue until the fin structure 110 reach a predetermined height. In some other embodiments, the fin structure 110 has a width that gradually increases from the top portion to the lower portion.

Figure 1C:
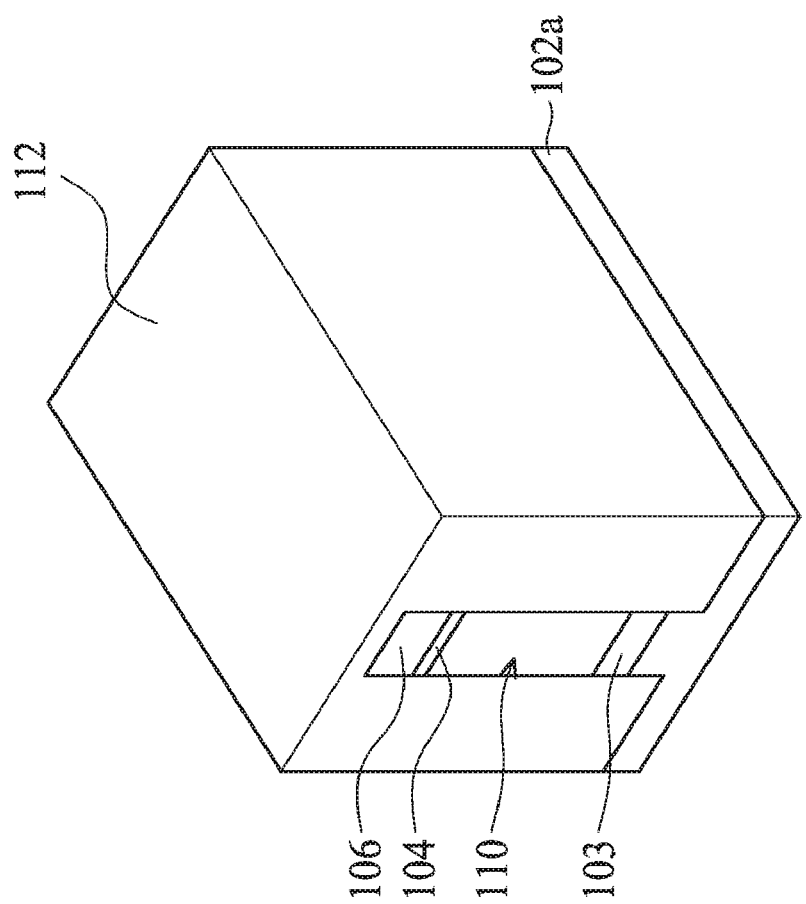

After the fin structure 110 is formed, the patterned dielectric layer 104 and the patterned mask layer 106 are removed. An insulating layer 112 is formed to cover the fin structure 110 over the substrate 102 as shown in FIG. 1C, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition. (CND) process, a spin-on-glass process, or another applicable process.

Figure 1D:
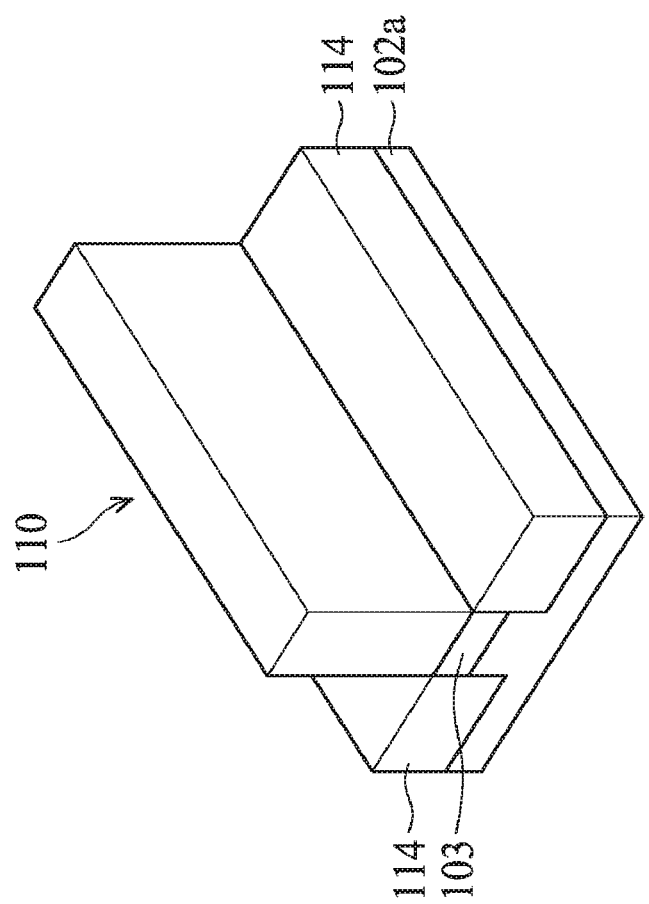

Afterwards, the insulating layer 112 is thinned or planarized to expose the top surface of the fin structure 110 as shown in FIG. 1D, in accordance with some embodiments. In some embodiments, the insulating layer 112 is thinned by a chemical mechanical polishing (CMP) process.

As a result, an isolation structure 114, such as a shallow trench isolation (STI) structure, surrounds the fin structure 110. In some embodiments, a lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference or crosstalk.

It should be noted that a top surface of the stop layer 103 is located at a position that is level with a top surface of the isolation structure 114. More specifically, the stop layer 103 is surrounded by the isolation structure 114, the fin structure 110 and the first substrate 102a.

In some embodiments, the stop layer 103 has a thickness in a range from about 1 nm to about 50 nm. If the thickness is smaller than 1 nm, the etch stop ability of the stop layer 103 is not good enough. If the thickness is greater than 50 nm, the thermal budget may be increased.

Figure 1E:
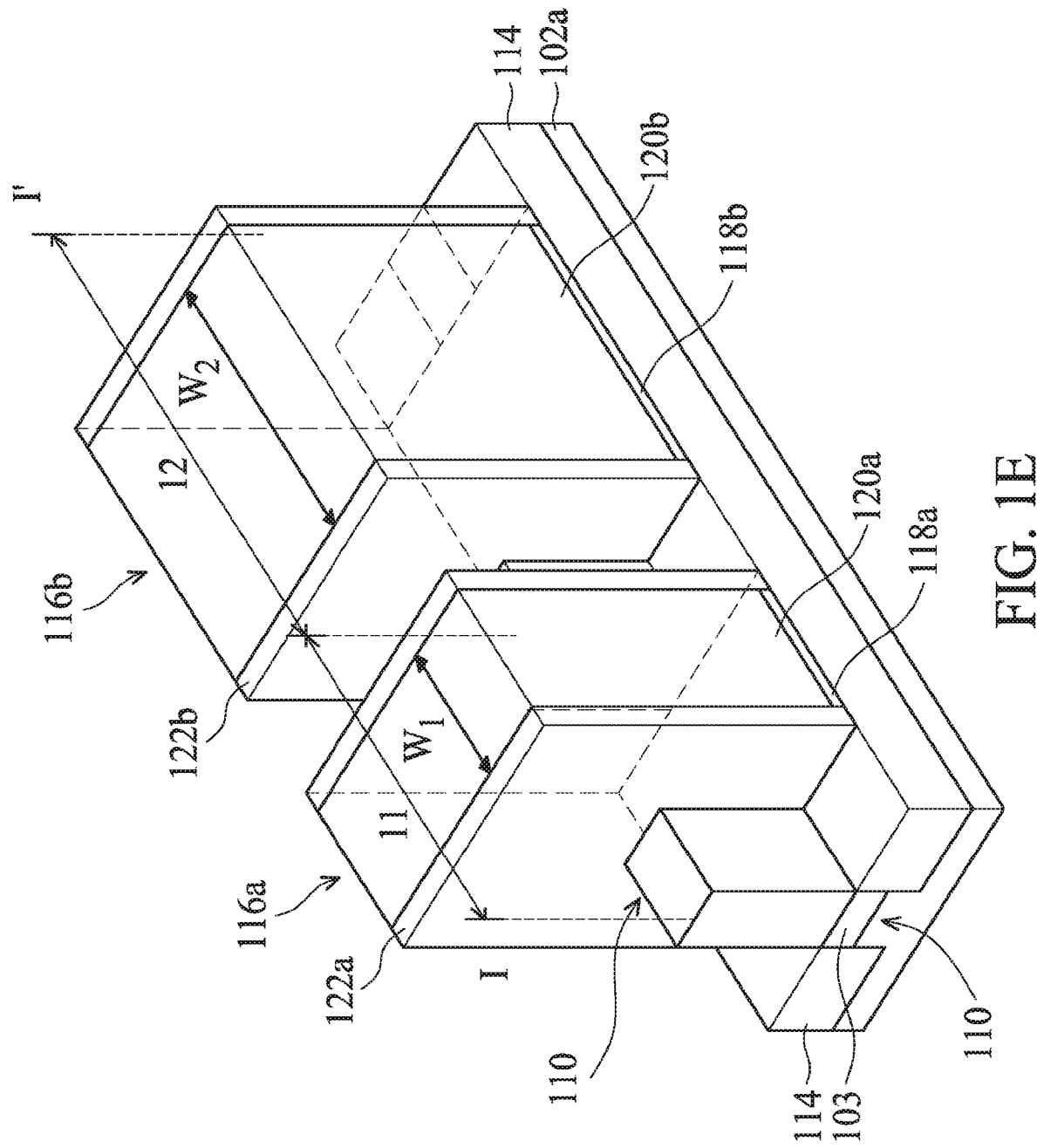

Afterwards, a first dummy gate structure 116a and a second dummy gate structure 116b are formed across the fin structure 110 and extend over the isolation structure 114 as shown in FIG. 1E, in accordance with some embodiments. The first dummy gate structure 116a is formed in a first region 11 and the second dummy gate structure 116b is formed in a second region 12.

In some embodiments, the first dummy gate structure 116a includes a first dummy gate dielectric layer 118a and a first dummy gate electrode layer 120a formed over the first dummy gate dielectric layer 118a. In some embodiments, the second dummy gate structure 116b includes a second dummy gate dielectric layer 118b and a second dummy gate electrode layer 120b formed over the second dummy gate dielectric layer 118b.

After the first dummy gate structure 116a and the second dummy gate structure 116b are formed, first spacers 122a are formed on the opposite sidewalls of the first dummy gate structure 116a, and second spacers 122b are formed on the opposite sidewalls of the second dummy gate structure 116b. The first spacers 122a and the second spacers 122b may be a single layer or multiple layers.

In some embodiments, the first dummy gate structure 116a has a first width $W_1$ in a direction parallel to the fin structure 110, and the second dummy gate structure 116b has a second width $W_2$ in a direction parallel to the fin structure 110. In other words, the first width $W_1$ is measured from an edge of the first spacers 122a to an edge of the opposite first spacer 122a. The second width $W_2$ is measured from an edge of the second spacers 122b to an edge of the opposite second spacer 122b. The first width $W_1$ is smaller than the second width $W_2$.

Figure 1F:
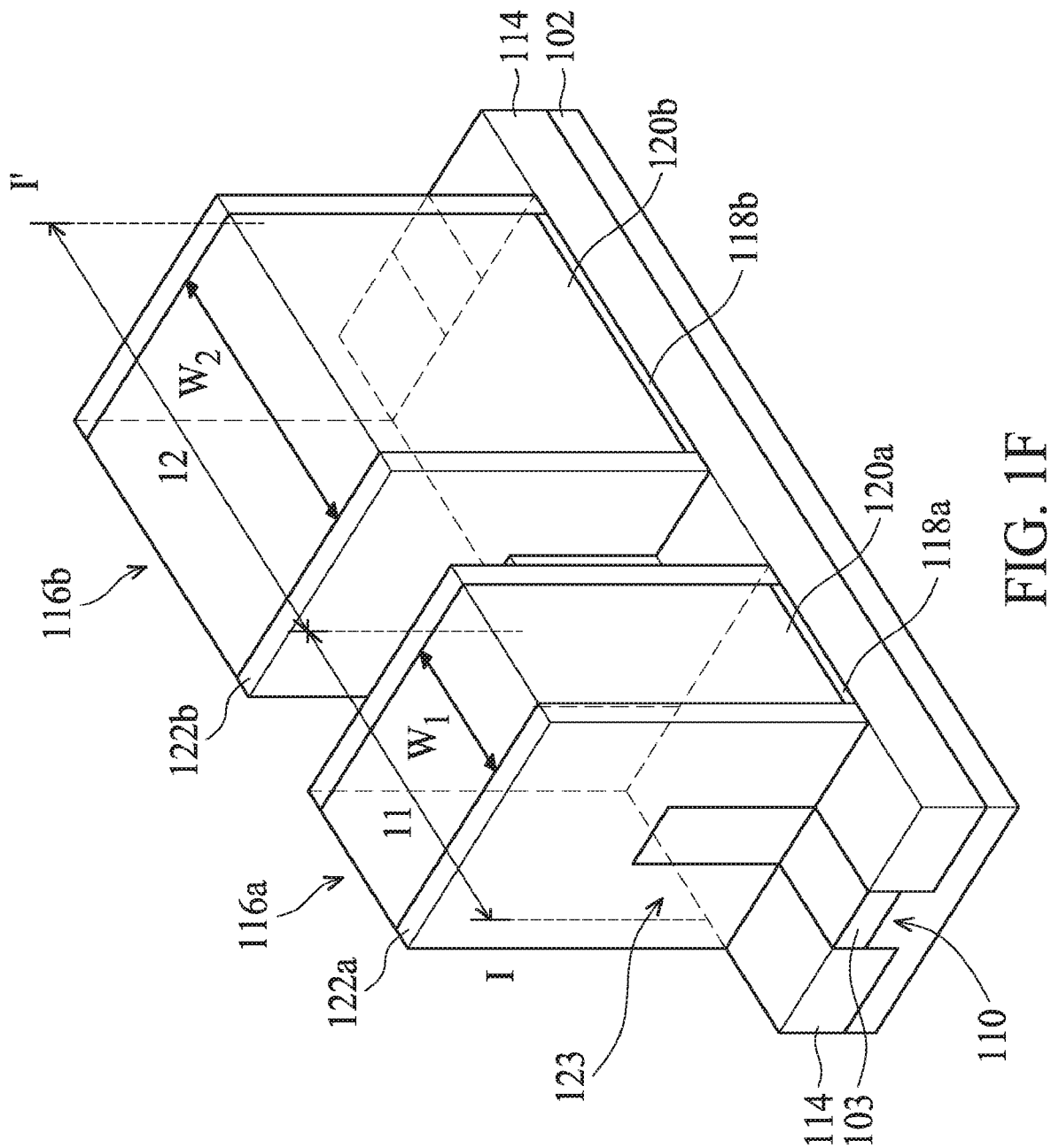
Figure 1G:
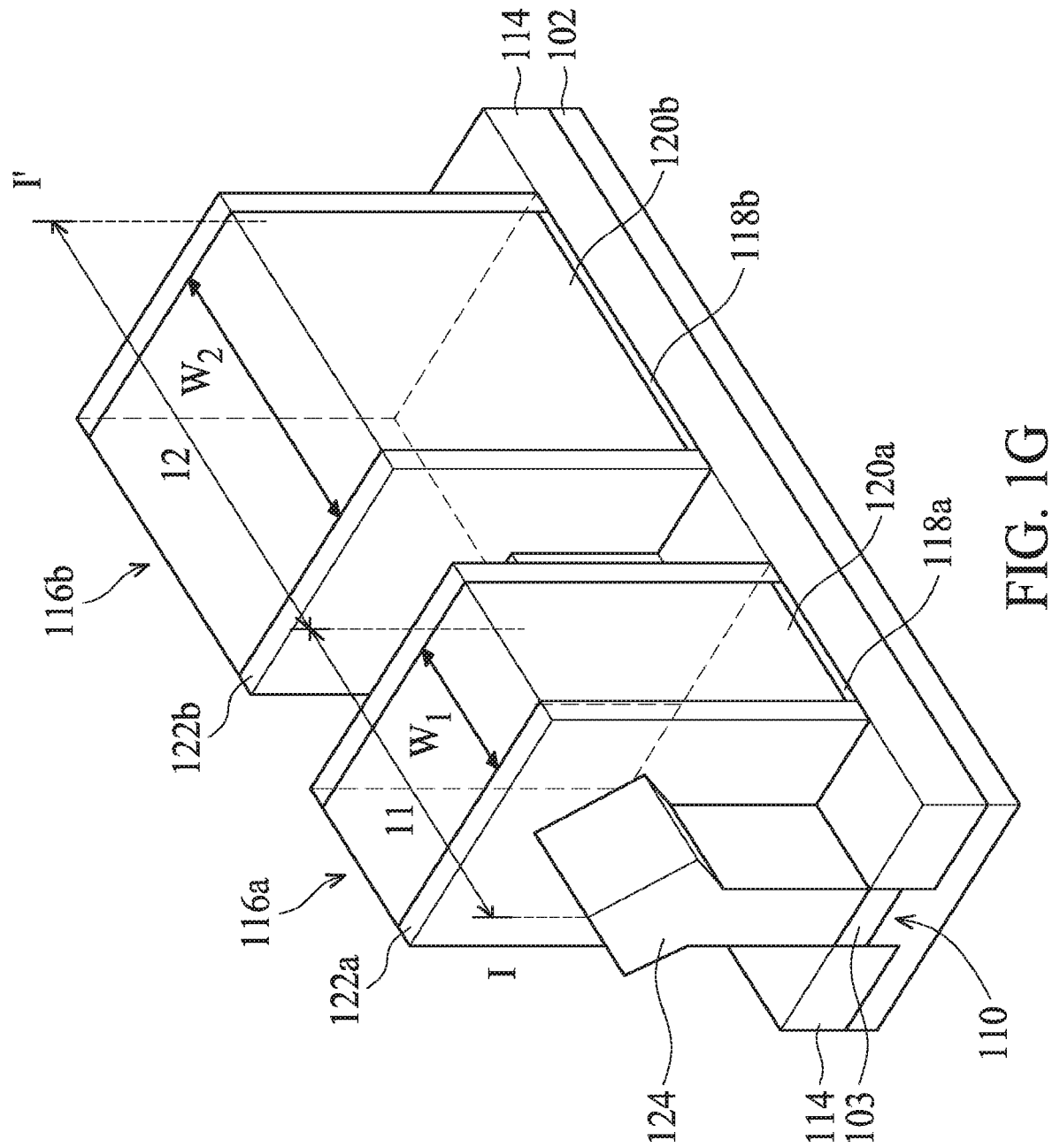
Figure 1H:
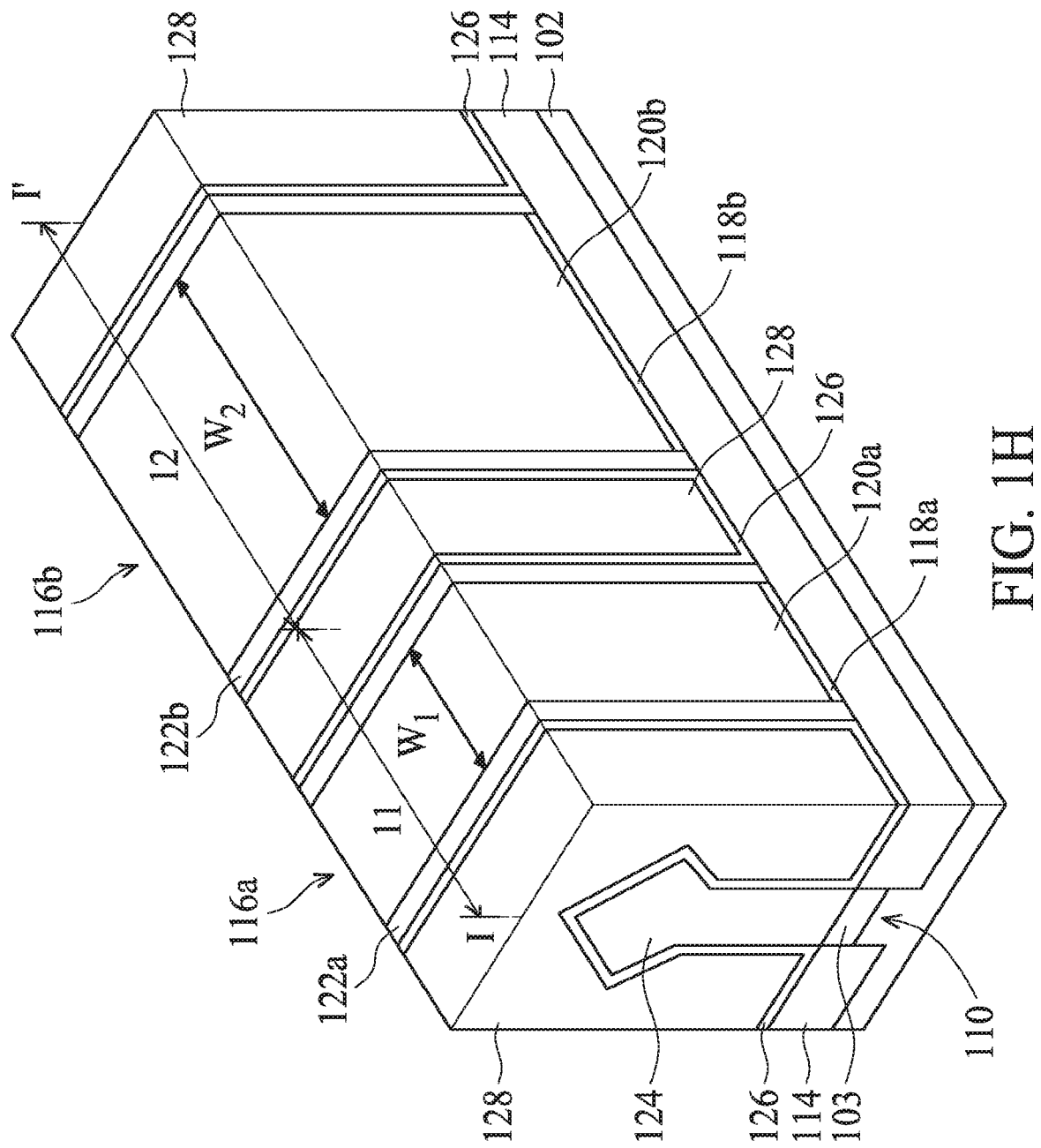
Figure 1I:
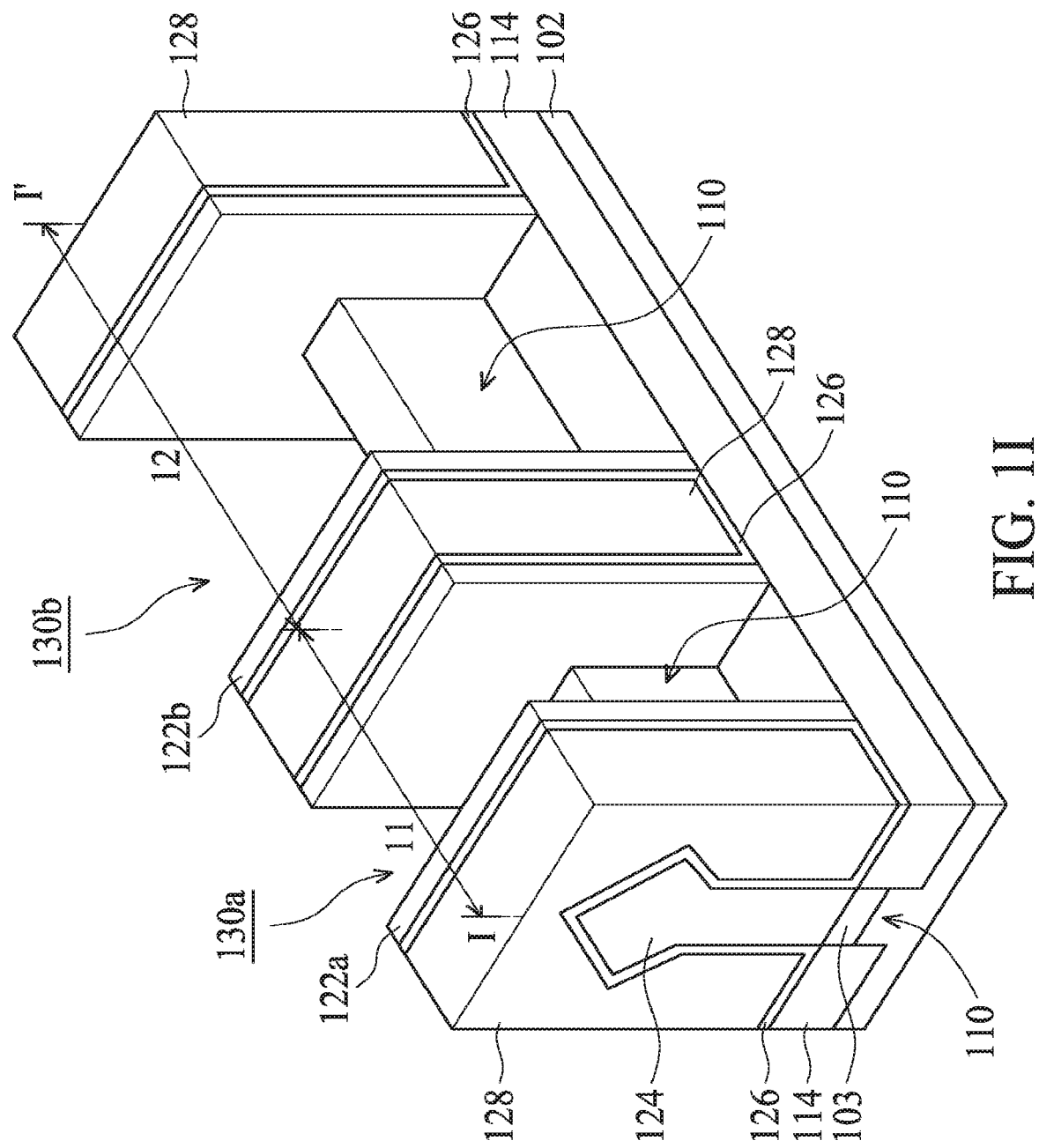
Figure 1J:
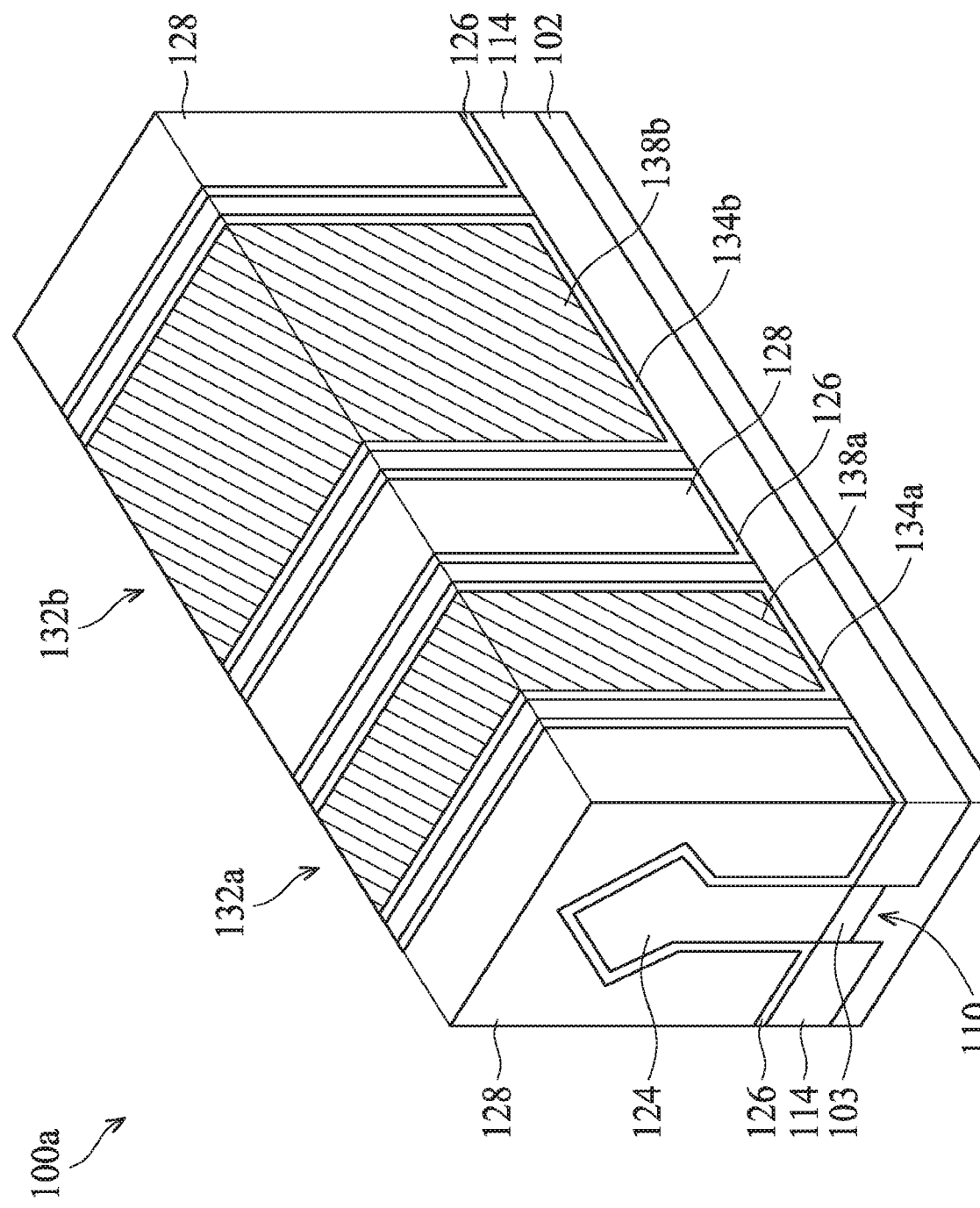
Figure 2A:
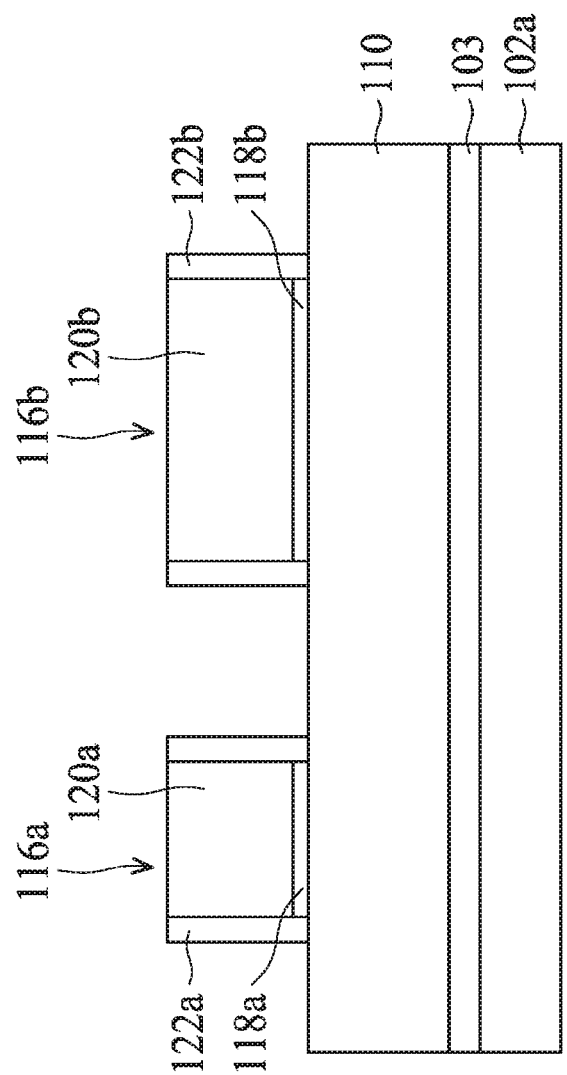
FIGS. 2A-2F are cross-sectional representations of various stages of forming FinFET device structure shown in FIGS. 1F to 1J in accordance with some embodiments.

FIGS. 2A-2F are cross-sectional representations of various stages of forming FinFET device structure 100a shown in FIGS. 1E to 1J in accordance with some embodiments. FIG. 2A shows a cross-sectional representation of the FinFET device structure taken along line II' of FIG. 1E, in accordance with some embodiments. As shown in FIG. 2A, the first dummy gate structure 116a and the second dummy gate structure 116b are formed over the fin structure 110 and the stop layer 103.

Figure 2B:
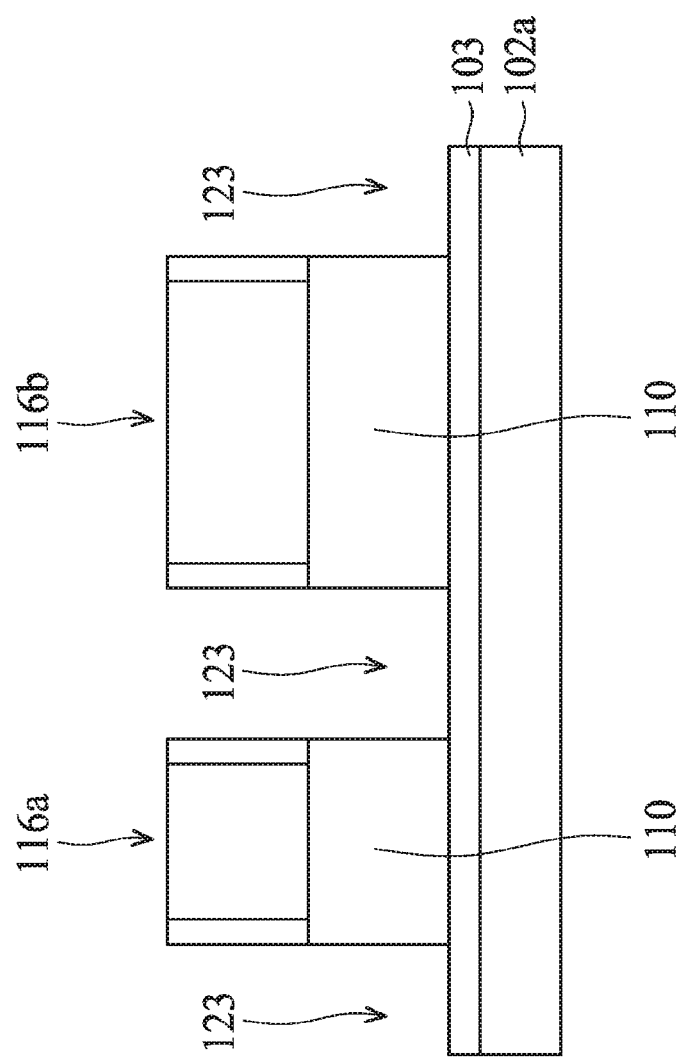

Afterwards, a top portion of the fin structure 110 adjacent to the first dummy gate structure 116a and the second dummy gate structure 116b is removed as shown in FIG. 1F and FIG. 2B, in accordance with some embodiments. As a result, a recess 123 is formed over the stop layer 103. A bottom surface of the recess 123 is level with the top surface of the stop layer 103. In some embodiments, a portion of the fin structure 110 adjacent to the first dummy gate structure 116a and the second dummy gate structure 116b are recessed to form recesses 123 at two sides of fin structure 110. In some embodiments, the top portion of the fin structure 110 is removed by an etching process, and the etching process stops at the top surface of the stop layer 103.

It should be noted that the etching process stops at the top surface of the stop layer 103, and therefore the etch depth of the recess 123 in the vertical direction is controlled by using the stop layer 103. The etch width of the recess 123 in the horizontal direction may be adjusted according to a applications. As a result, the etching profile of the recess 123 may be controlled.

Figure 2C:
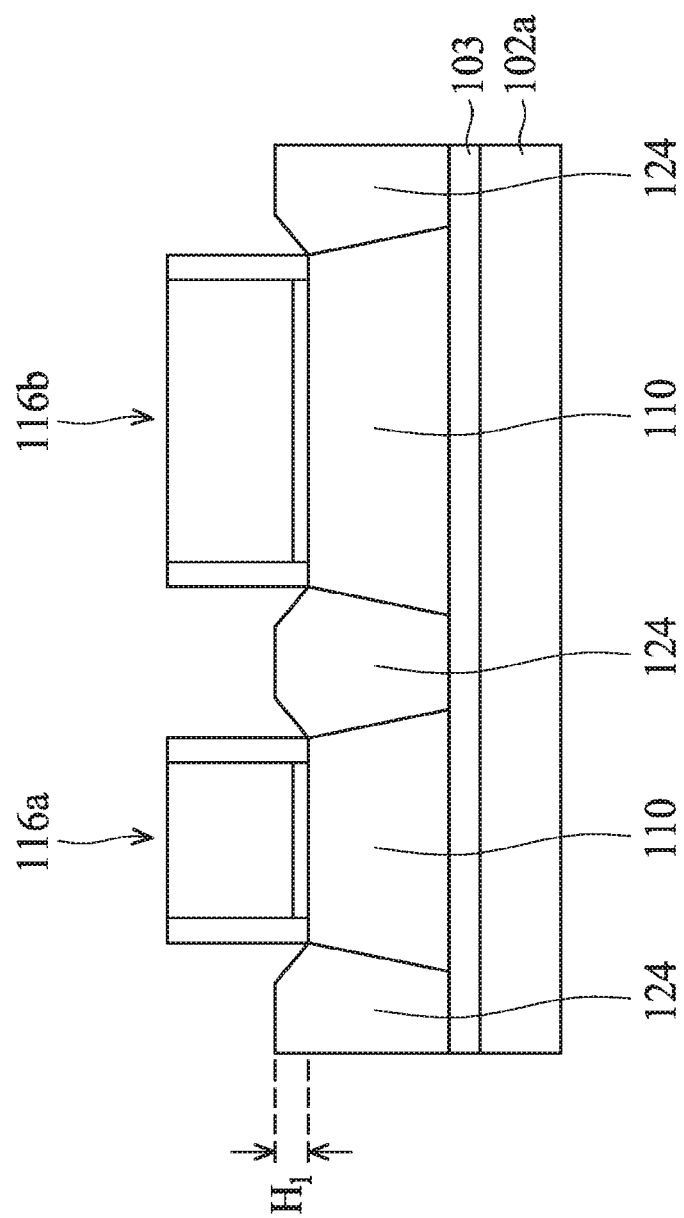

Afterwards, a source/drain (S/D) structure 124 is formed in the recess 123 as shown in FIG. 1G and FIG. 2C, in accordance with some embodiments. The bottom surfaces of the S/D structure 124 are located at a position that is higher than a bottom surface of the stop layer 103. More specifically, the bottom surface of the S/D structure 124 is located at position that is level with the top surface of the stop layer 103. The bottom surface of the S/D structure 124 is in direct contact with the top surface of the stop layer 103.

In some embodiments, a strained material is grown in the recess 123 by an epitaxial (epi) process to form the source/drain (S/D) structure 124. In addition, the lattice constant of the strained material may be different from the lattice constant of the substrate 102. In some embodiments, the source/drain structure 124 includes Ge, SiGe, InAs, InGaAs, InSb, GaAs, GaSb, InAlP, InP, or the like. When an N-type FET (NFET) device is desired, the S/D structure 124 may include an epitaxially grown silicon (epi Si). Alternatively, when a P-type FET (PFET) device is desired, the S/D structure 124 may include an epitaxially grown silicon germanium (SiGe). In some embodiments, the S/D structure 124 and the stop layer 103 are made of different materials.

In some embodiments, the S/D structure 124 has a diamond-like shape. The S/D structure 124 has a raised height $H_1$ over the top surface of the fin structure 110. If raised height $H_1$ is too large, gate spacers 122a, 122b may collapse due to compressive stress induced from the S/D structure 124. If raised height $H_1$ is too small, a contact landing window will be smaller than predetermined value.

Figure 2D:
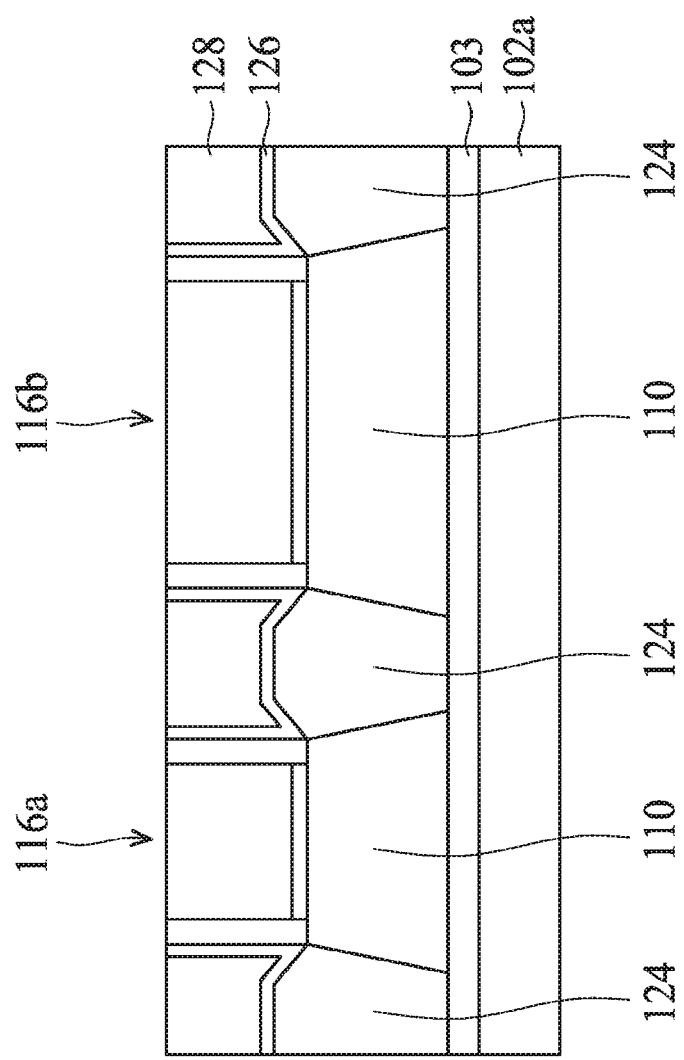

After the S/D structure 124 is formed, a contact etch stop layer (CESL) 126 is formed over the substrate 102, and an inter-layer dielectric (ILD) structure 128 is formed over the contact etch stop layer 126 as shown in FIG. 1H and FIG. 2D, in accordance with some embodiments.

In some embodiments, the contact etch stop layer 126 is made of silicon nitride, silicon oxynitride, and/or other applicable materials. The contact etch stop layer 126 may be formed by plasma enhanced CVD, low pressure CVD, ALD, or other applicable processes.

The ILD structure 128 may include multilayers made of multiple dielectric materials, such as silicon oxide, silicon nitride, silicon oxynitride, tetraethoxysilane (TEOS), phosphosilicate glass (PSG), horophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 128 may be formed by chemical vapor deposition (CVD), physical vapor deposition, (PVD), atomic layer deposition (ALD), spin-on coating, or other applicable processes.

Afterwards, a polishing process is performed to the ILD structure 128 until the top surface of the first dummy gate structure 116a and the top surface of the second dummy gate structure 116b are exposed. In some embodiments, the ILD structure 128 is planarized by a chemical mechanical polishing (CMP) process.

Figure 2E:
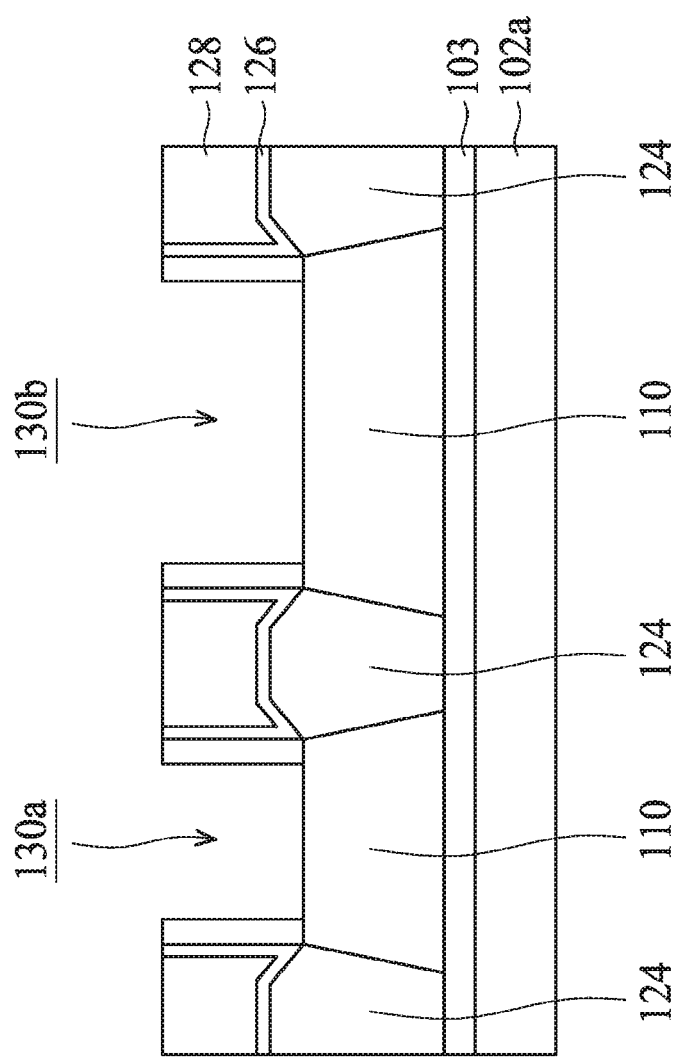

After the ILD structure 128 is formed, the first dummy gate structure 116a is removed to form a first trench 130a in the ILD structure 128 and the second dummy gate structure 116b is removed to form a second trench 130b in the ILD structure 128 as shown in FIG. 1I and FIG. 2E, in accordance with some embodiments. The first dummy gate structure 116a and the second dummy gate structure 116b may be removed by a wet etching process or a dry etching process.

Figure 2F:
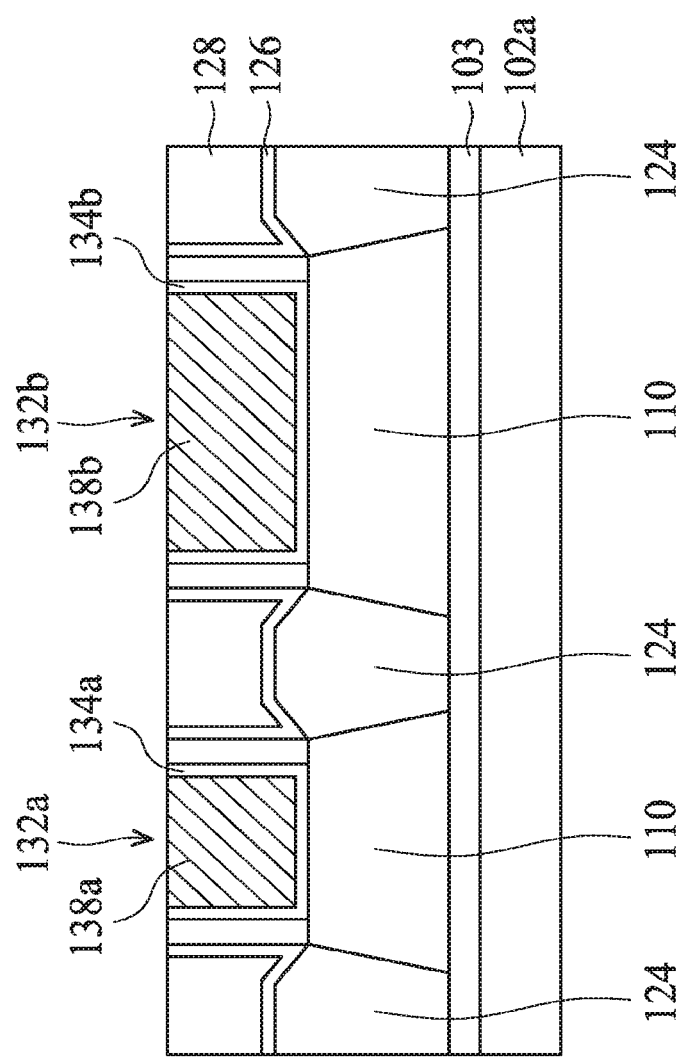

After the first trench 130a and the second trench 130b are formed, a first gate structure 132a and a second gate structure 132b are formed in the first trench 130a and the second trench 130b, respectively, as shown in FIG. 1J and FIG. 2F, in accordance with some embodiments.

The first gate structure 132a includes a first gate dielectric layer 134a and a first gate electrode layer 138a. The second gate structure 132b includes a second gate dielectric layer 134b and a second gate electrode layer 138b.

The gate dielectric layers 134a, 134b may be a single layer or multiple layers. The gate dielectric layers 134a, 134b are independently made of silicon oxide (SiOx), silicon nitride (SixNy), silicon oxynitride (SiON), dielectric material(s) with low dielectric constant (low-k), or combinations thereof. In some embodiments, the gate dielectric layer 134 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the gate dielectric layers 134a, 134b are deposited by a plasma enhanced chemical vapor deposition (PECVD) process or a spin coating process.

In some other embodiments, a work function layer (not shown) is formed between the gate dielectric layers 134a, 134b and the gate electrode layers 138a, 138b. In some embodiments, the work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or combinations thereof. The P-work-function metal includes titanium nitride (TiN), tungsten nitride (WN), tantalum nitride (TaN), ruthenium (Ru) or combinations thereof.

The gate electrode layers 138a, 138b are made of conductive material, such as aluminum (Al), copper (Cu), tungsten (W), titanium (Ti), tantalum (Ta), or other applicable materials. The gate electrode layers 138a, 138b are formed by a deposition process, such as chemical vapor deposition (CVD), physical vapor deposition (PVD), atomic layer deposition (ALD), high density plasma CVD (HDP-CVD), metal organic CVD (MOCVD), or plasma enhanced CVD (PECVD).

A channel region is formed below the first gate structure 132a and the second gate structure 132b, and the channel region is wrapped by the first gate structure 132a and the second gate structure 132b. The material of the S/D structure 124 is different from that of the first substrate 102a. Accordingly, a channel region of the FinFET device structure 100a is strained or stressed to enable carrier mobility of a device and enhance device performance.

The recess 123 (shown in FIG. 1F and FIG. 2B) defines a surface proximity. The surface proximity is the distance that the top surface of the fin structure 110 extends from a side a of the gate structure 132a, 132b to the recess 123 (or if the recess 123 is filled, the S/D structure 124). As mentioned above, the etch depth of the recess 123 in the vertical direction may be stopped at the stop layer 103. Once the etch height is stopped, the etch width in the horizontal direction may be controlled by adjusted the etching parameters of the etching process. As a result, an etching profile of the recess 123 may be controlled. In other words, the portion of the fin structure 110 may largely be etched in a lateral direction, with minimal vertical direction etching. Therefore, the surface proximity is decreased. When the surface proximity is decreased, the performance and reliability of the FinFET device structure 100a is improved. In addition, the drain induction barrier lower (DIBL) effect is inhibited.

The lattice constant of the stop layer 103 is different from that of the first gate electrode layer 138a and the second gate electrode layer 138b. Accordingly, the channel region of the FinFET device structure 100a may be strained or stressed because of the difference of the lattice constant between the two materials.

For regions with different exposed areas (or etched areas), it is difficult to control etch uniformity due to the loading effect. Depending on the etching strategy, the loading effect is the etch rate for a larger area being either faster or slower than it is for a smaller area. In other words, the loading effect is the etch rate in large area being mismatched with the etch rate in small area. This means that the loading effect may be affected by the pattern density. Therefore, while etching the fin structure 110 in the first region 11 and the second region 12, it is more difficult to control the uniformity of the etch depth. By inserting the stop layer 103 between the fin structure 110 and the first substrate 102a, the loading effect due to the different pattern density is reduced.

Figure 3A:
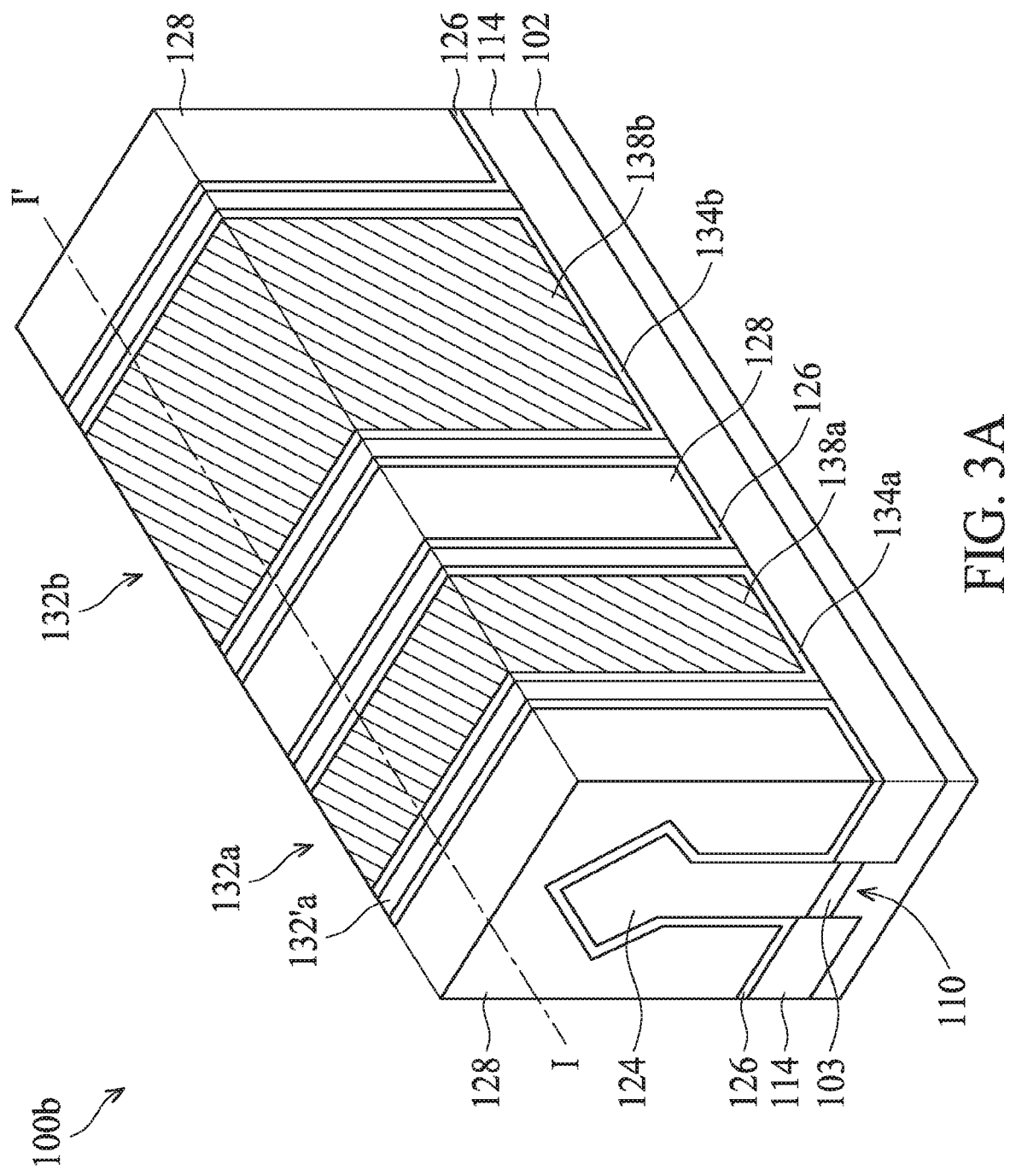
FIG. 3A is a perspective view of a semiconductor structure in accordance with some embodiments.
Figure 3B:
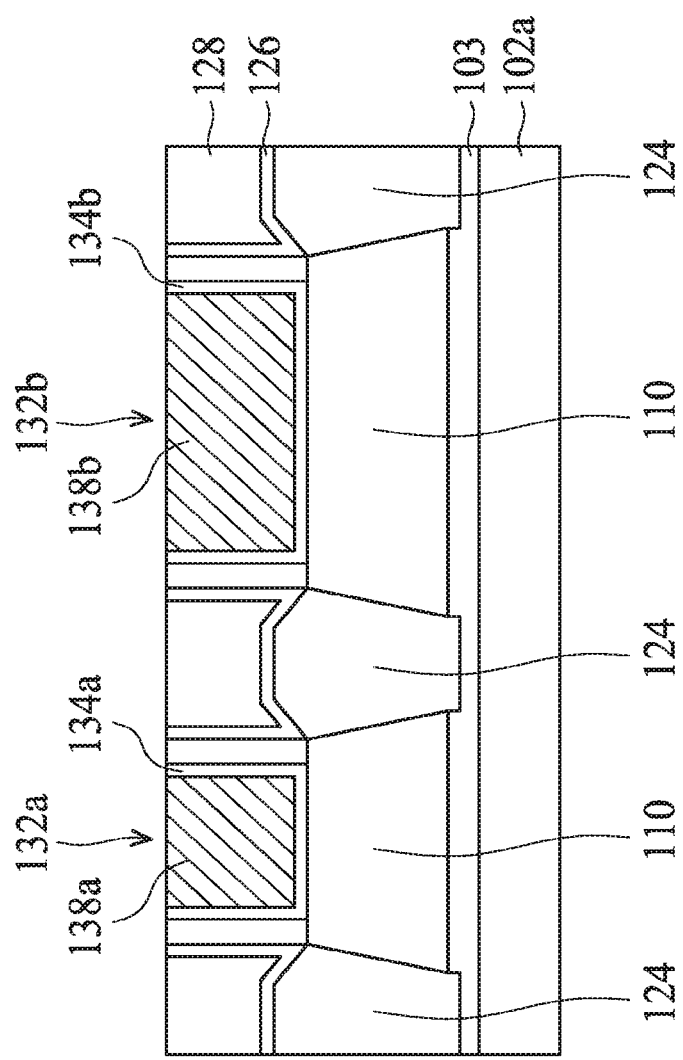
FIG. 3B shows a cross-sectional representation of the FinFET device structure taken along line II' of FIG. 3A, in accordance with some embodiments.

FIG. 3A is a perspective view of a semiconductor structure 100b in accordance with some embodiments. Some processes and materials used to form semiconductor structure 100b are similar to, or the same as, those used to form semiconductor structure 100a and are not repeated herein. FIG. 3B shows a cross-sectional representation of the FinFET device structure taken along line II' of FIG. 3A, in accordance with some embodiments.

As shown in FIG. 3A, the top surface of the stop layer 103 is located at a position that is lower than the top surface of the isolation structure 114. The sidewalls of the stop layer 103 are completely in direct contact with the isolation structure 114.

As shown in FIG. 3B, a bottom portion of the S/D structure 124 is formed in the stop layer 103. A portion of the S/D structure 124 is inserted into the stop layer 103. In other words, the bottom surface of the S/D structure 124 is located at a position that is higher than the bottom surface of the stop layer 103. The bottom surface of the S/D structure 124 is located at a position that is lower than the top surface of the stop layer 103.

Figure 4A:
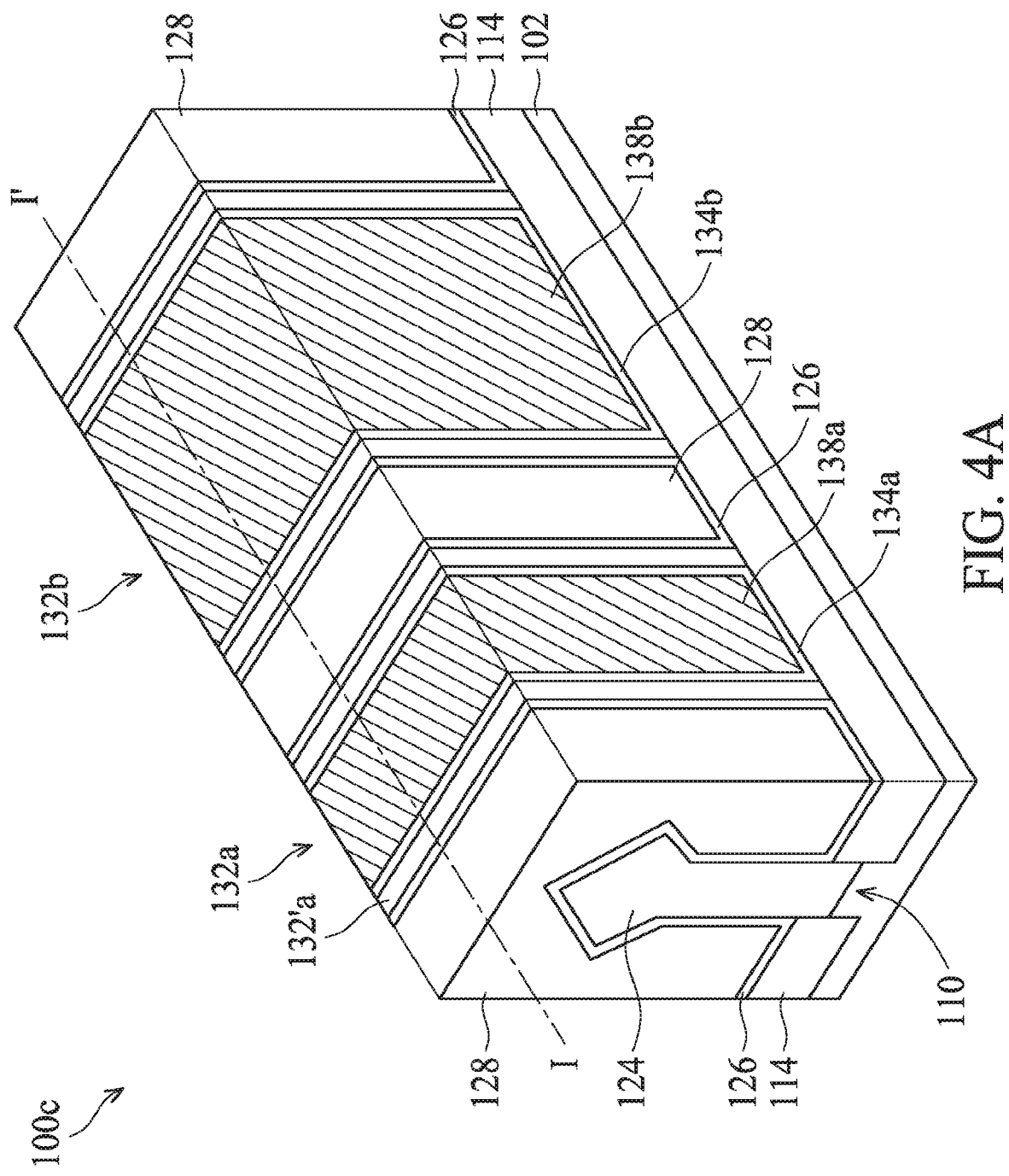
FIG. 4A is a perspective view of a semiconductor structure in accordance with some embodiments.
Figure 4B:
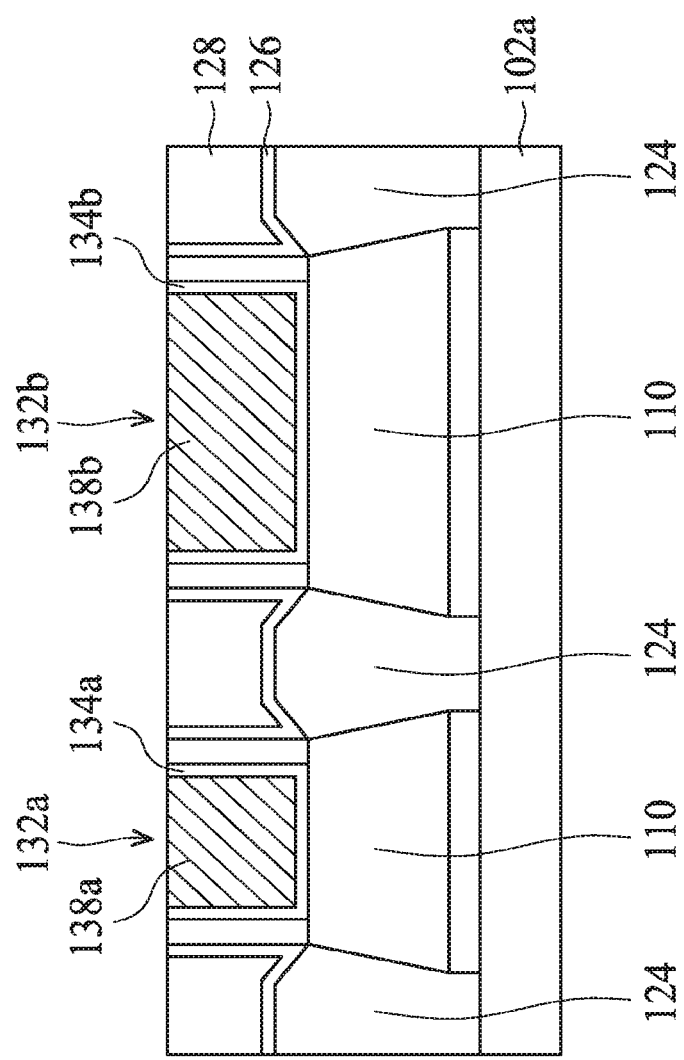
FIG. 4B shows a cross-sectional representation of the FinFET device structure taken along line II' of FIG. 4A, in accordance with some embodiments.

FIG. 4A is a perspective view of a semiconductor structure 100c in accordance with some embodiments. Some processes and materials used to form semiconductor structure 100c are similar to, or the same as, those used to form semiconductor structure 100a and are not repeated herein. FIG. 4B shows a cross-sectional representation of the FinFET device structure taken along line II' of FIG. 4A, in accordance with some embodiments.

As shown in FIG. 4A, a portion of the stop layer 103 is removed, and the bottom surface of the S/D structure 124 is in direct contact with the top surface of the first substrate 102a.

As shown in FIG. 4B, the remaining stop layer 103 is formed directly below the first gate structure 132a and the second gate structure 132b. No stop layer is formed directly below the S/D structure 124.

Figure 5A:
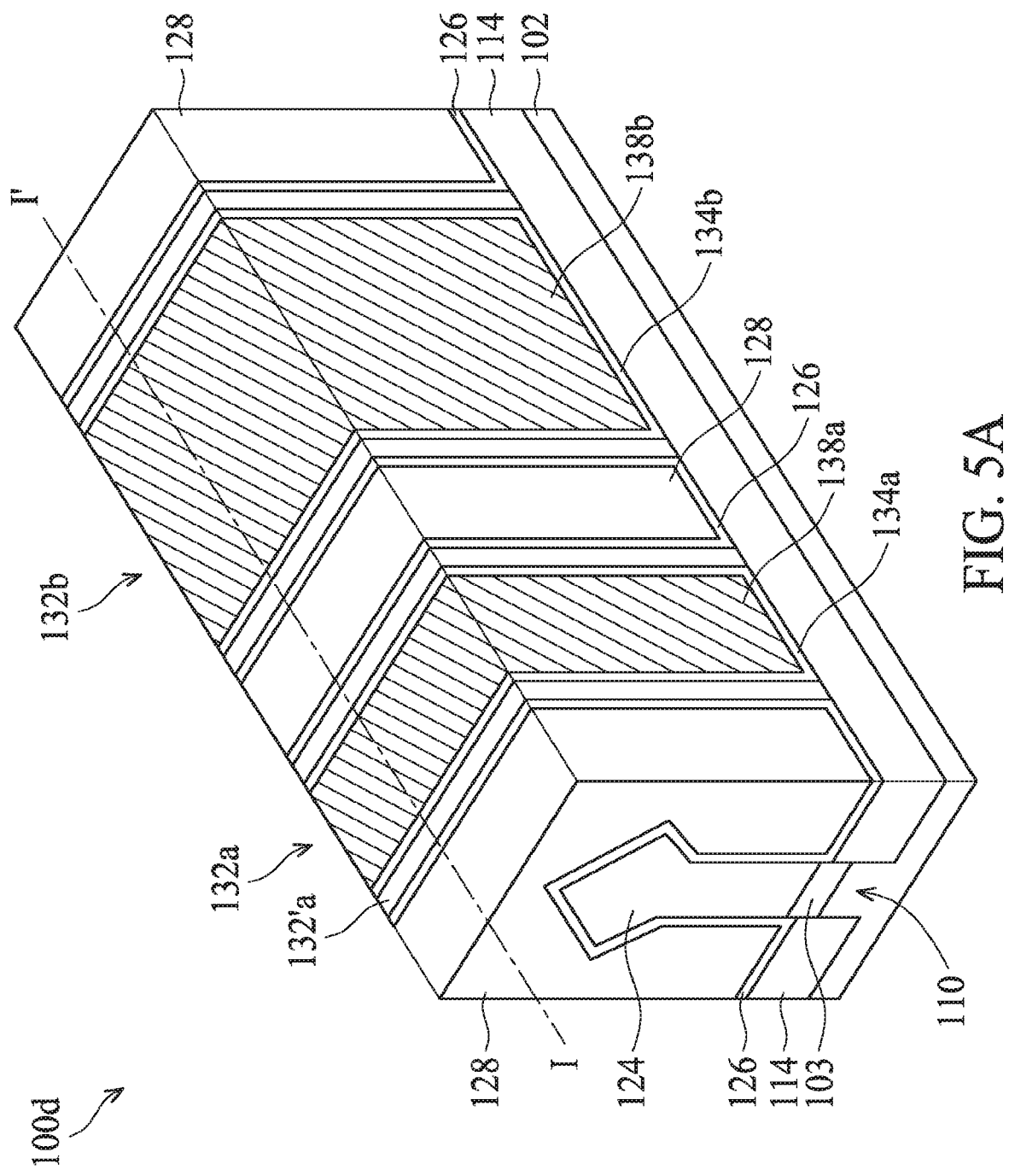
FIG. 5A is a perspective view of a semiconductor structure in accordance with some embodiments.
Figure 5B:
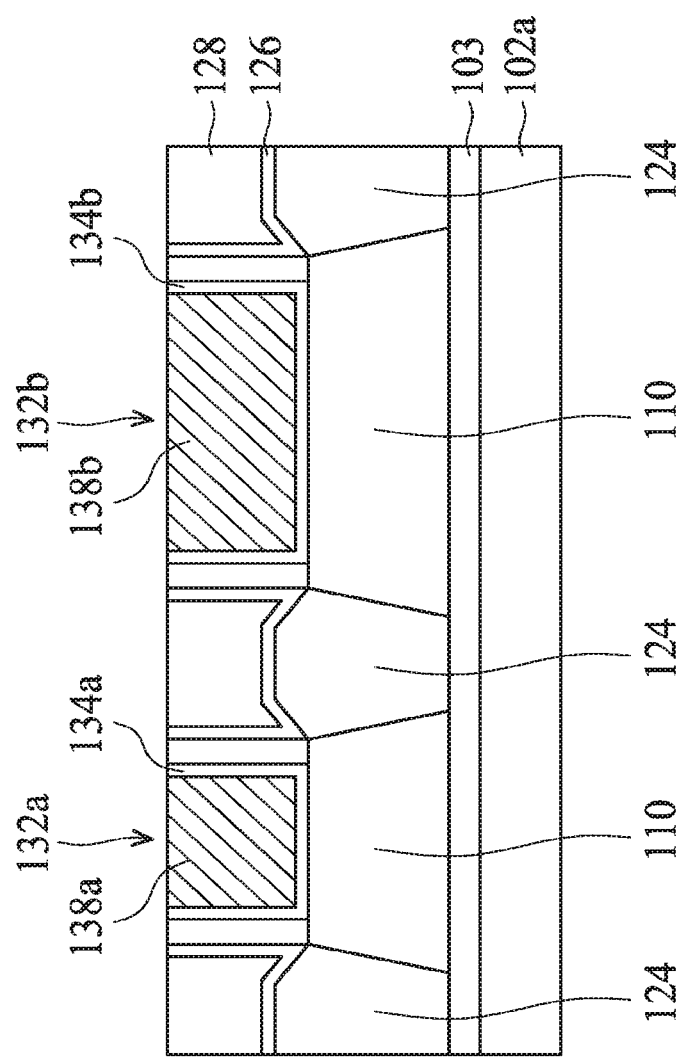
FIG. 5B shows a cross-sectional representation of the FinFET device structure taken along line II' of FIG. 5A, in accordance with some embodiments.

FIG. 5A is a perspective view of a semiconductor structure 100d in accordance with some embodiments. FIG. 5B shows a cross-sectional representation of the FinFET device structure taken along line II' of FIG. 5A, in accordance with some embodiments.

As shown in FIG. 5A, the top surface of the stop layer 103 is located at a position that is higher than the top surface of the isolation structure 114. In some embodiments, the middle portion of the stop layer 103 is substantially level with the top surface of the isolation structure 114.

As shown in FIG. 5B, the bottom surface of the S/D structure 124 is at a position that is higher than the bottom surface of the stop layer 103. The bottom surface of the S/D structure 124 is substantially level with the lop surface of the stop layer 103.

Figure 6A:
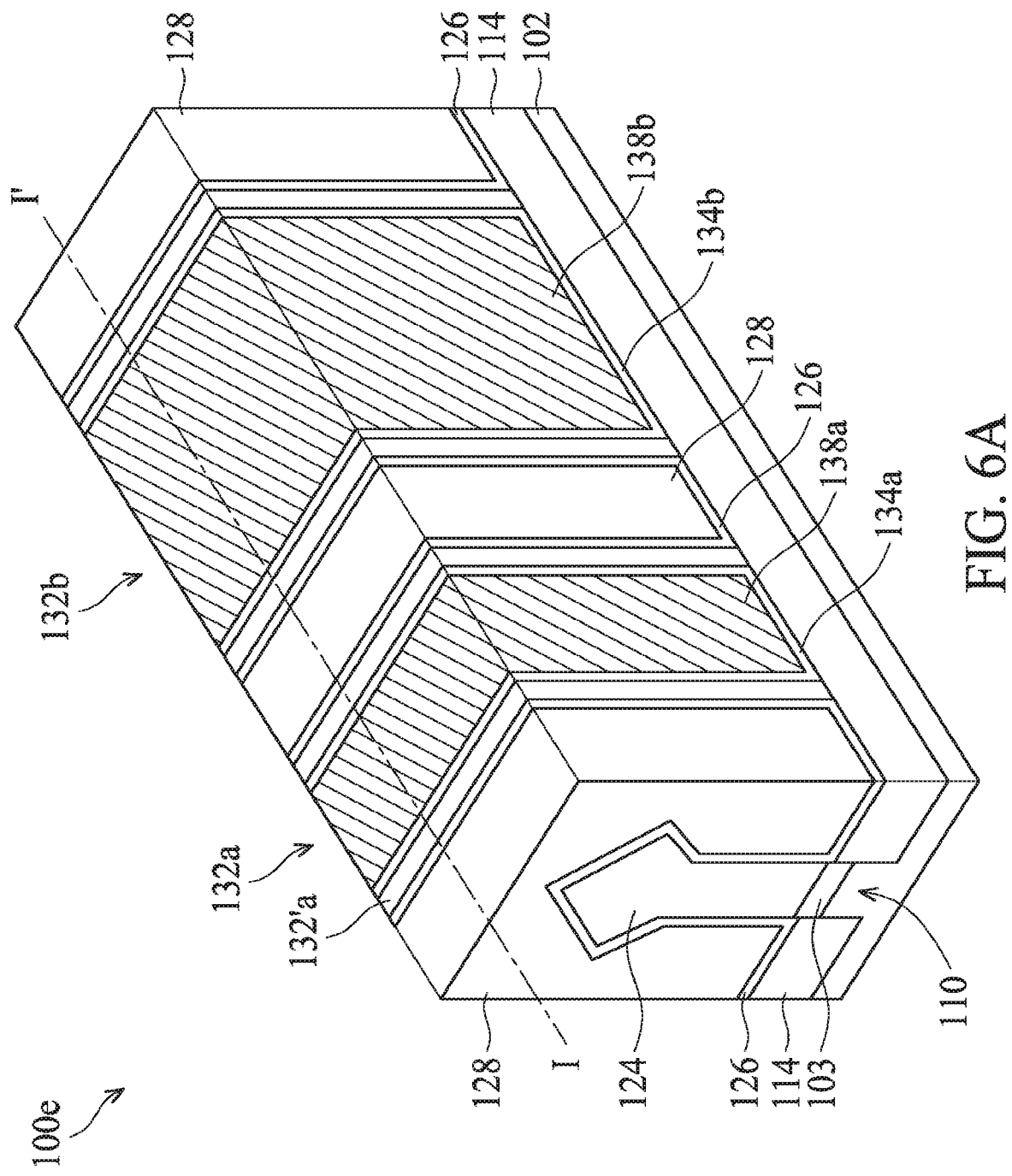
FIG. 6A is a perspective view of a semiconductor structure in accordance with some embodiments.
Figure 6B:
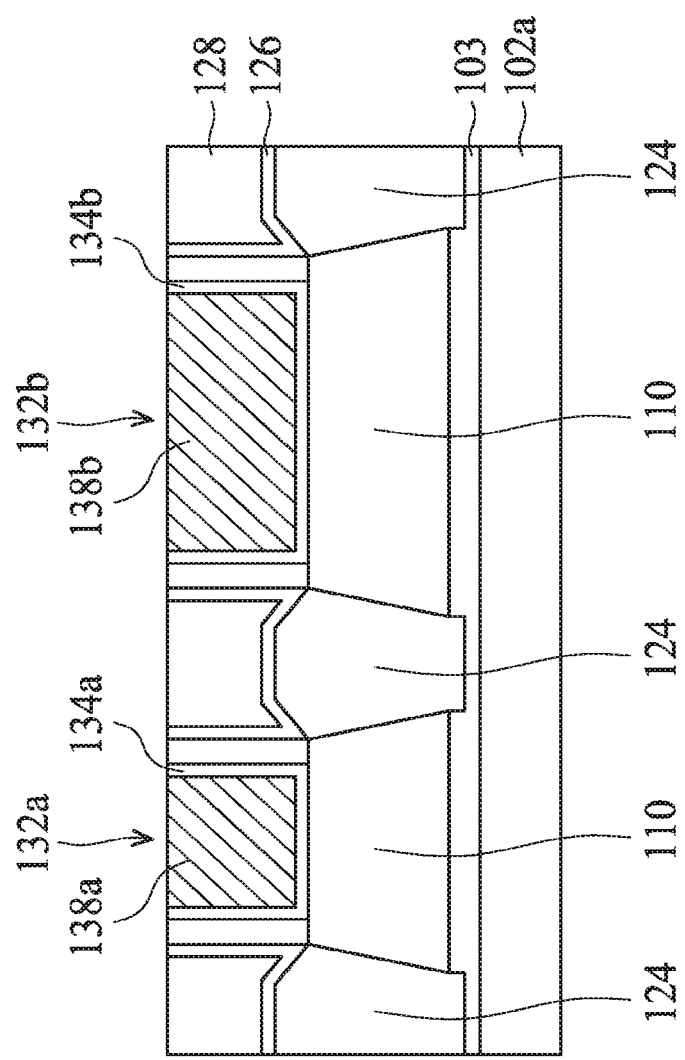
FIG. 6B shows a cross-sectional representation of the FinFET device structure taken along line II' of FIG. 6A, in accordance with some embodiments.

FIG. 6A is a perspective view of a semiconductor structure 100e in accordance with some embodiments. FIG. 6B shows a cross-sectional representation of the FinFET device structure taken along line II' of FIG. 6A, in accordance with some embodiments.

As shown in FIG. 6A, the top surface of the stop layer 103 is located at a position that is higher than the top surface of the isolation structure 114. In some embodiments, the middle portion of the stop layer 103 is substantially level with the stop surface of the isolation structure 114.

As shown in FIG. 6B, a portion of the S/D structure 124 is formed in the stop layer 103. A portion of the S/D structure 124 is inserted into the stop layer 103. The bottom surface of the S/D structure 124 is located at a position that is lower than the top surface of the stop layer 103.

Figure 7A:
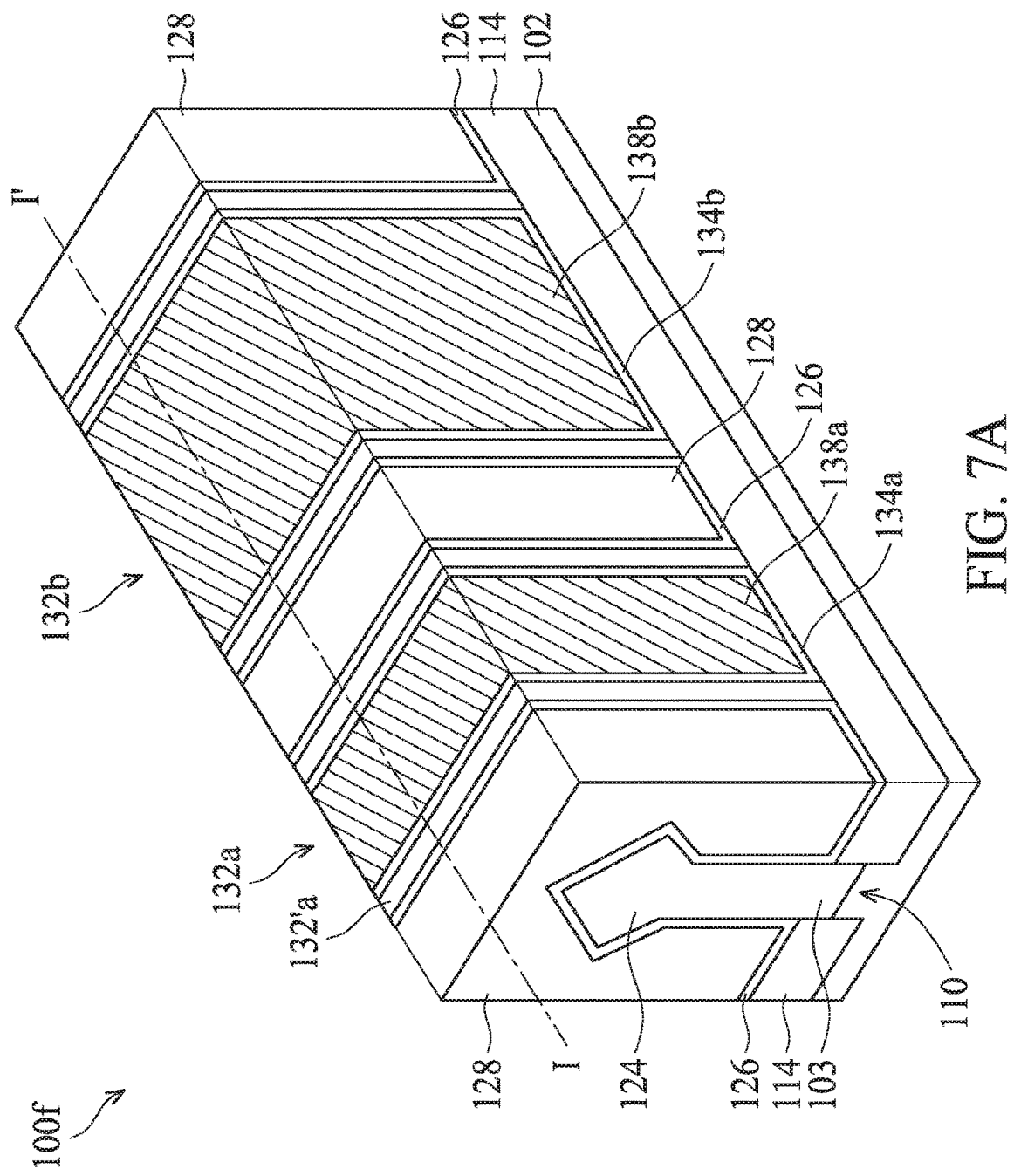
FIG. 7A is a perspective view of a semiconductor structure in accordance with some embodiments.
Figure 7B:
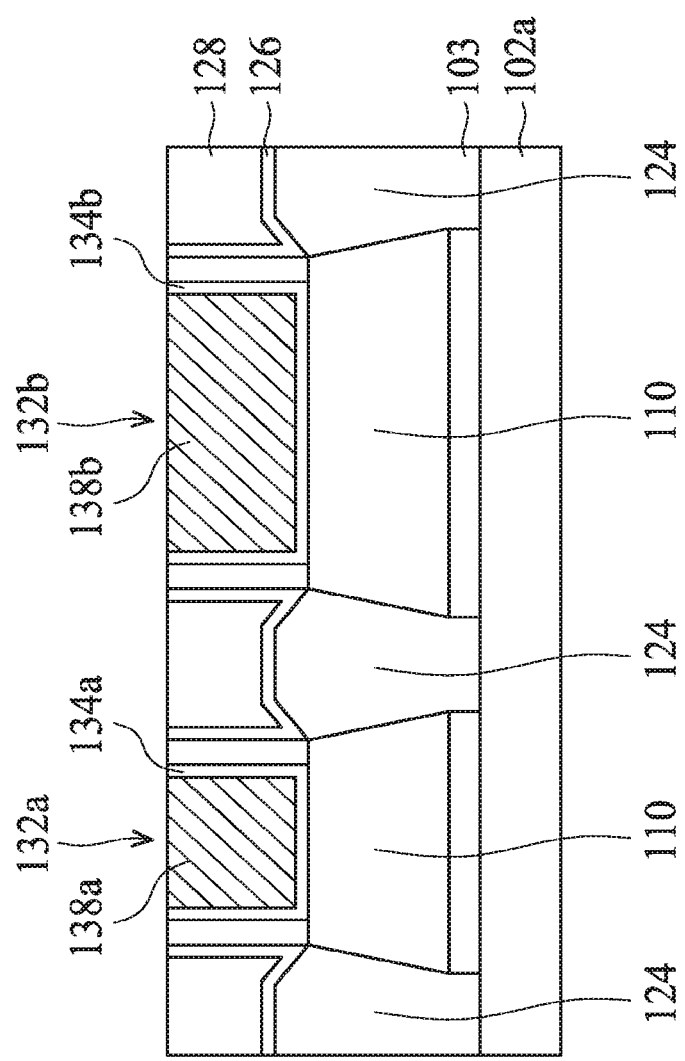
FIG. 7B shows a cross-sectional representation of the FinFET device structure taken along line II' of FIG. 7A, in accordance with some embodiments.

FIG. 7A is a perspective view of a semiconductor structure 100f in accordance with some embodiments. FIG. 7B shows a cross-sectional representation of the FinFET device structure taken along line II' of FIG. 7A, in accordance with some embodiments.

As shown in FIG. 7A, the bottom surface of the stop layer 103 is located at a position that is lower than the top surface of the isolation structure 114.

As shown in FIG. 7B, a portion of the S/D structure 124 is formed in the stop layer 103. The bottom surface of the S/D structure 124 is located at a position that is level with the bottom surface of the stop layer 103.

Figure 8A:
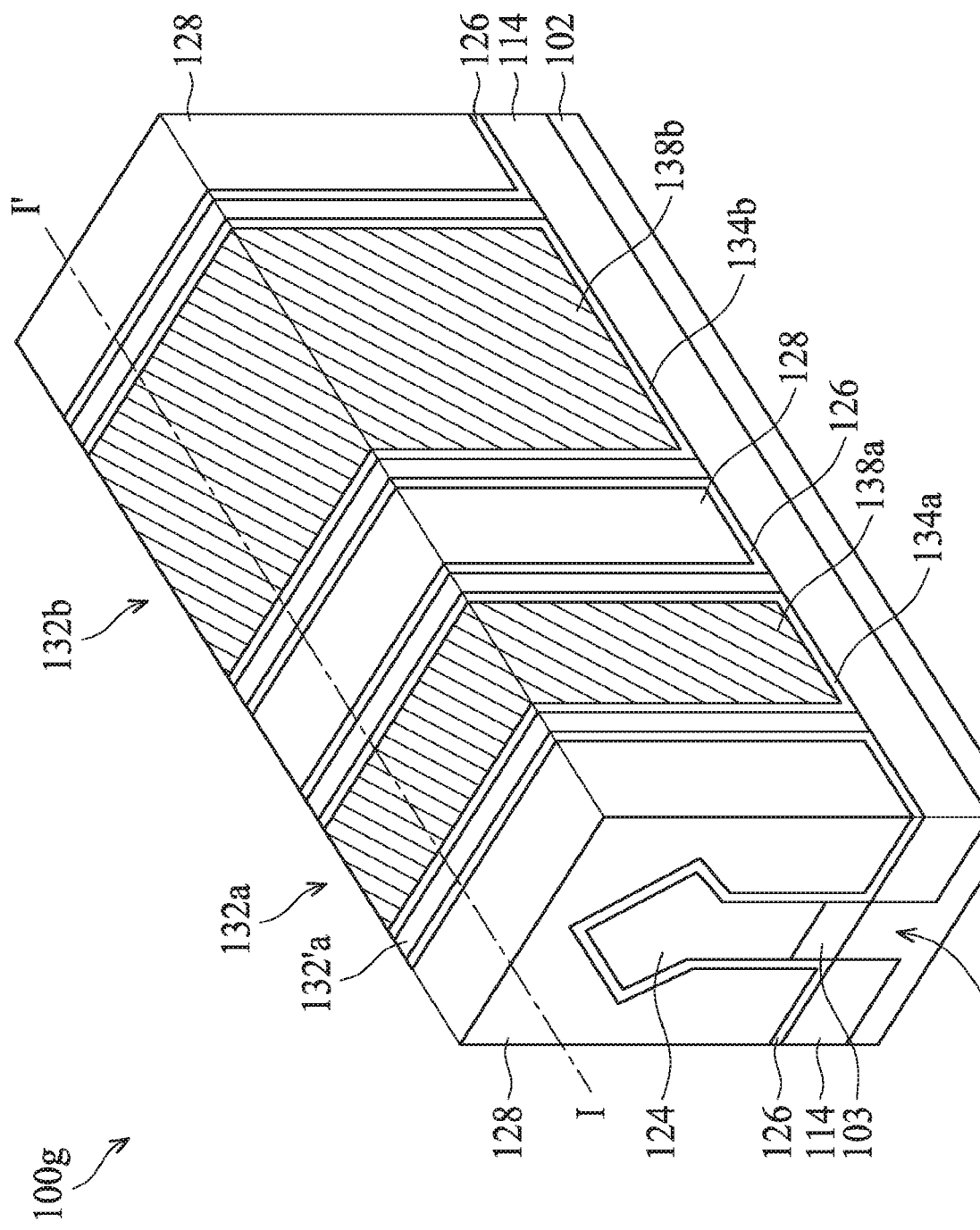
FIG. 8A is a perspective view of a semiconductor structure in accordance with some embodiments.
Figure 8B:
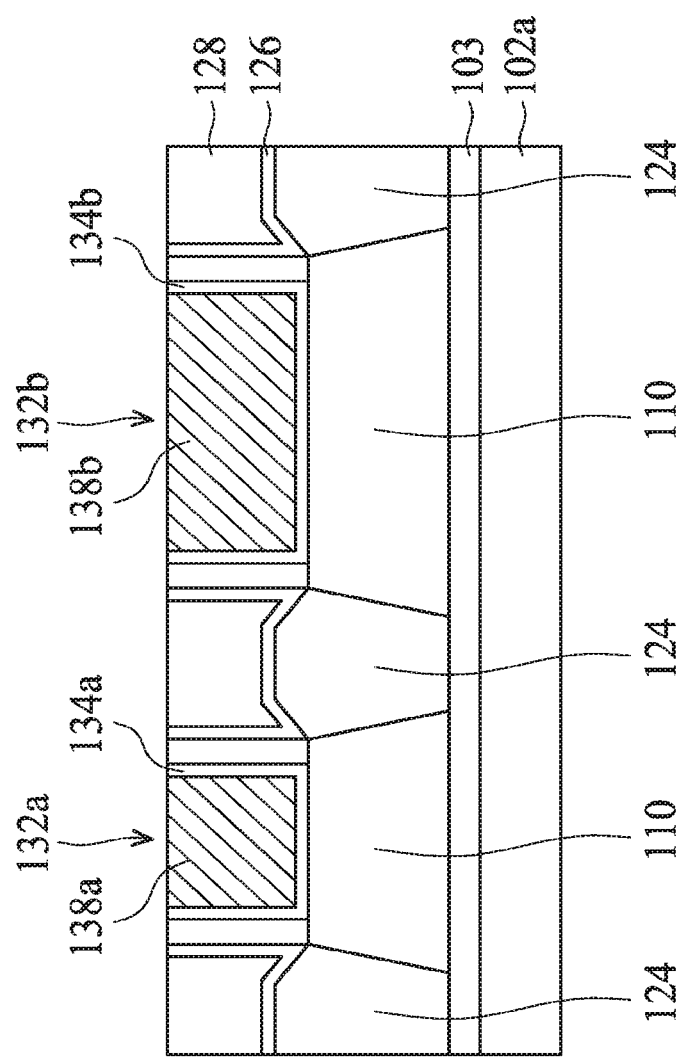
FIG. 8B shows a cross-sectional representation of the FinFET device structure taken along line II' of FIG. 8A, in accordance with some embodiments.

FIG. 8A is a perspective view of a semiconductor structure 100g in accordance with some embodiments. FIG. 8B shows a cross-sectional representation of the FinFET device structure taken along line II' of FIG. 8A, in accordance with some embodiments.

As shown in FIG. 8A, the bottom surface of the stop layer 103 is located at a position that is level with the top surface of the isolation structure 114. The top surface of the stop layer 103 is located at a position that is higher than the top surface of the isolation structure 114.

As shown in FIG. 8B, the bottom surface of the S/D structure 124 is located at a position that is level with the top surface of the stop layer 103.

Figure 9A:
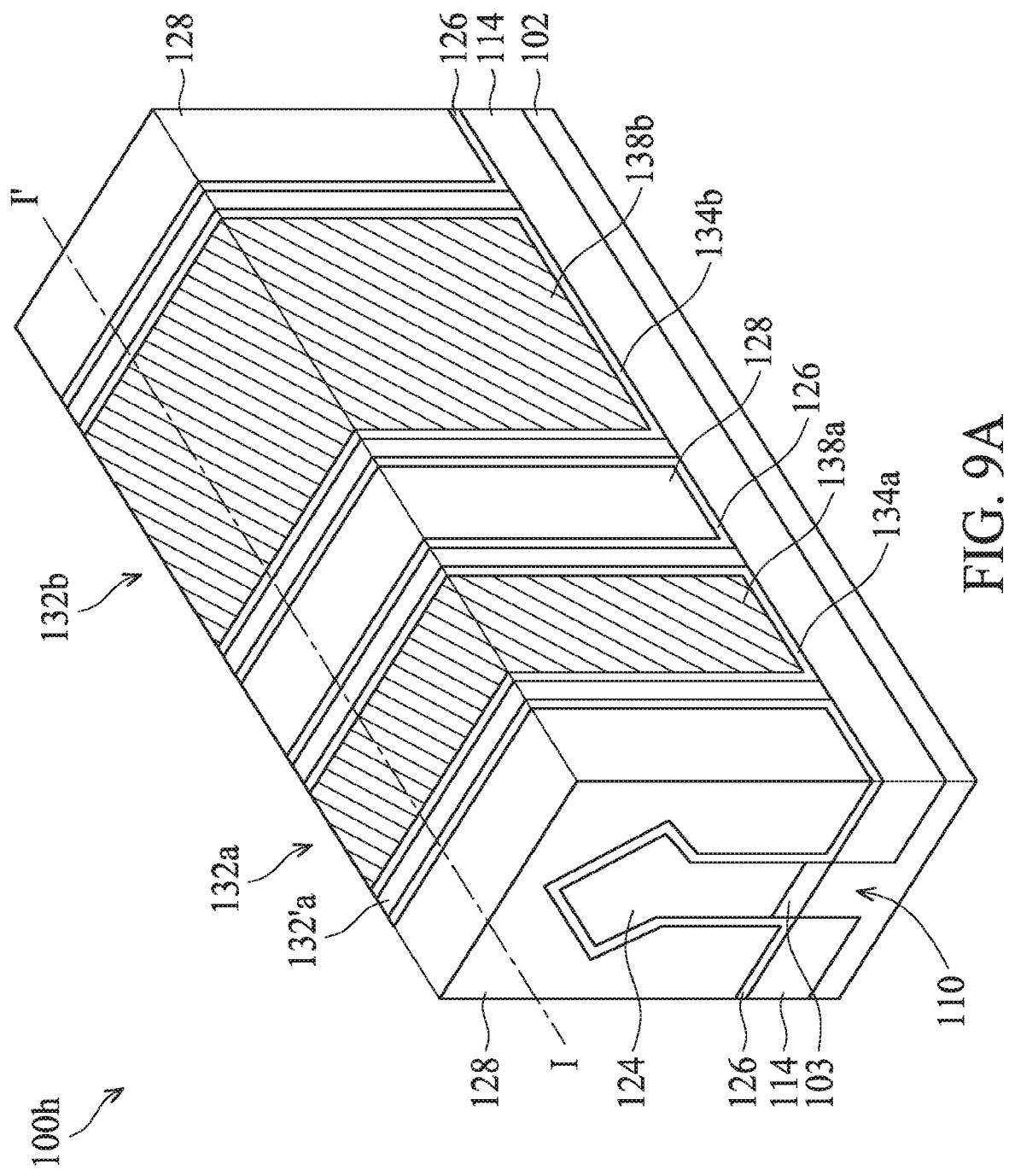
FIG. 9A is a perspective view of a semiconductor structure in accordance with some embodiments.
Figure 9B:
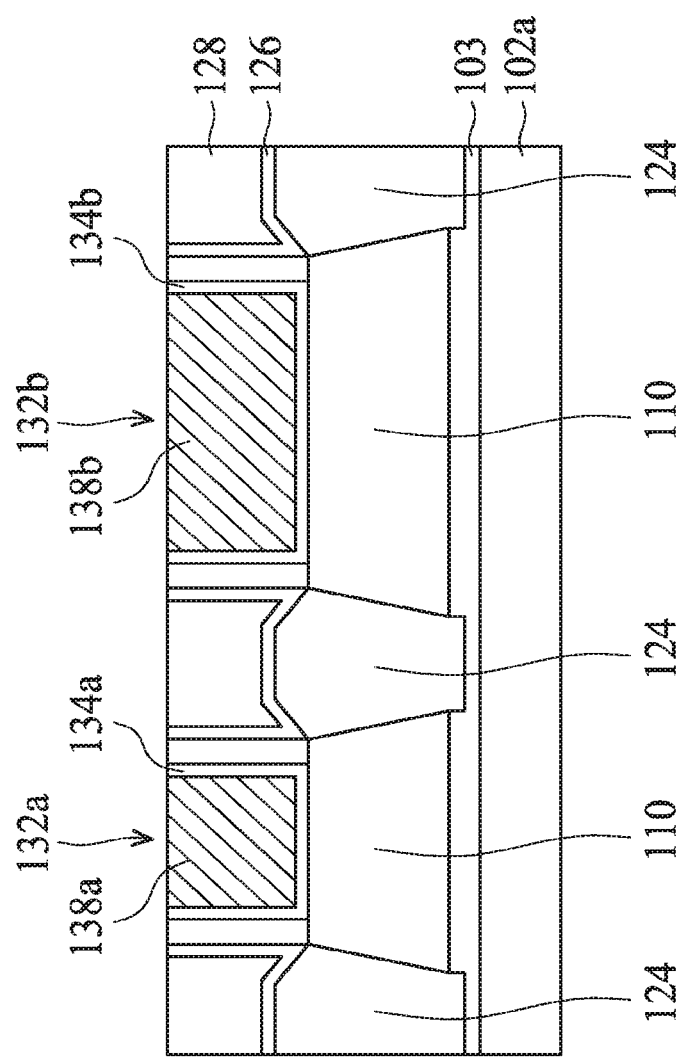
FIG. 9B shows a cross-sectional representation of the FinFET device structure taken along line II' of FIG. 9A, in accordance with some embodiments.

FIG. 9A is a perspective view of a semiconductor structure 100h in accordance with some embodiments. FIG. 9B shows a cross-sectional representation of the FinFET device structure taken along line II' of FIG. 9A, in accordance with some embodiments.

As shown in FIG. 9A, the top surface of the stop layer 103 is located at a position that is higher than the top surface of the isolation structure 114. The bottom surface of the stop layer 103 is located at a position that is level with the top surface of the isolation structure 114.

As shown in FIG. 9B, a portion of the S/D structure 124 is formed in the stop layer 103. The bottom surface of the S/D structure 124 is located at a position that is lower than the top surface of the stop layer 103.

Figure 10A:
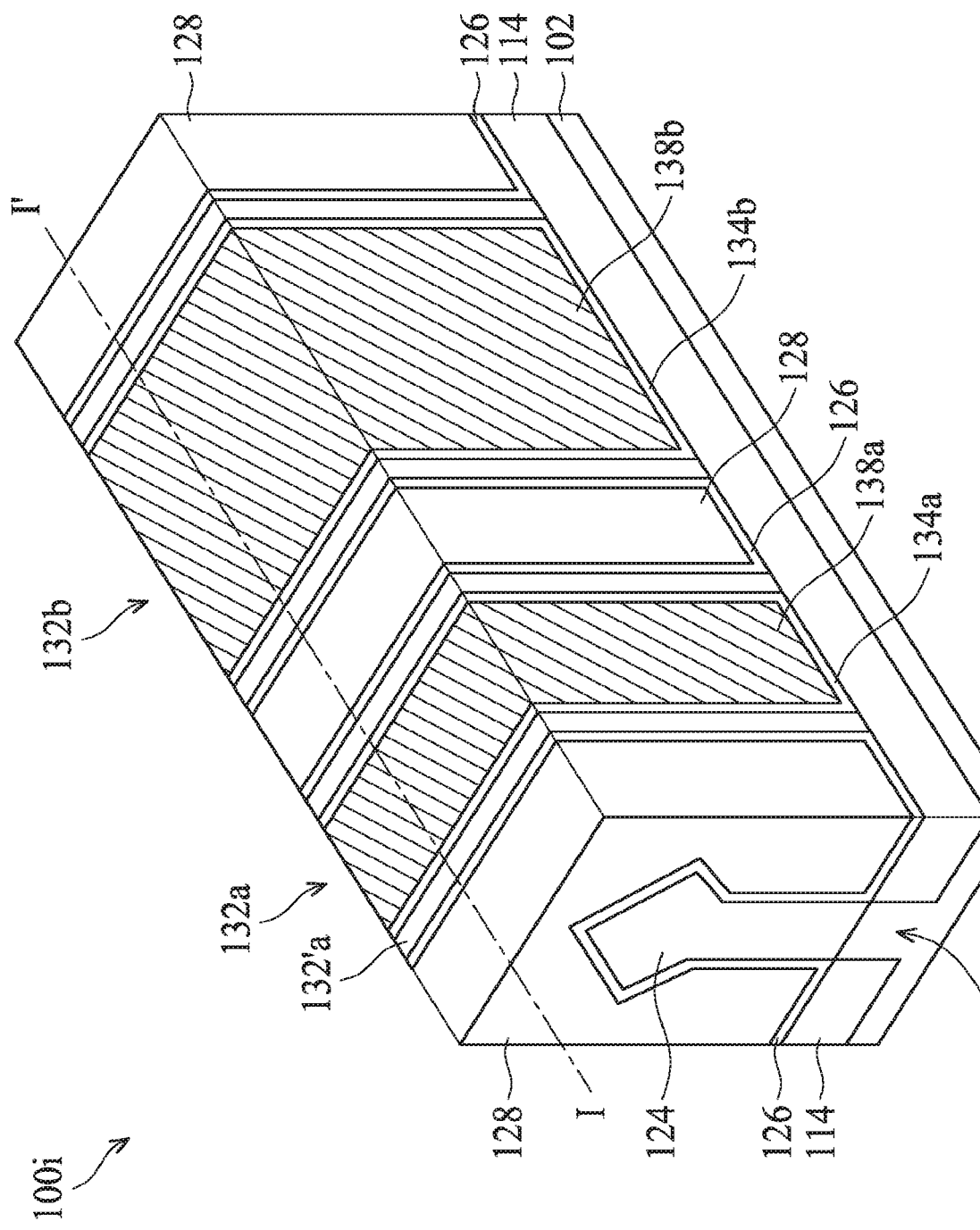
FIG. 10A is a perspective view of a semiconductor structure in accordance with some embodiments.
Figure 10B:
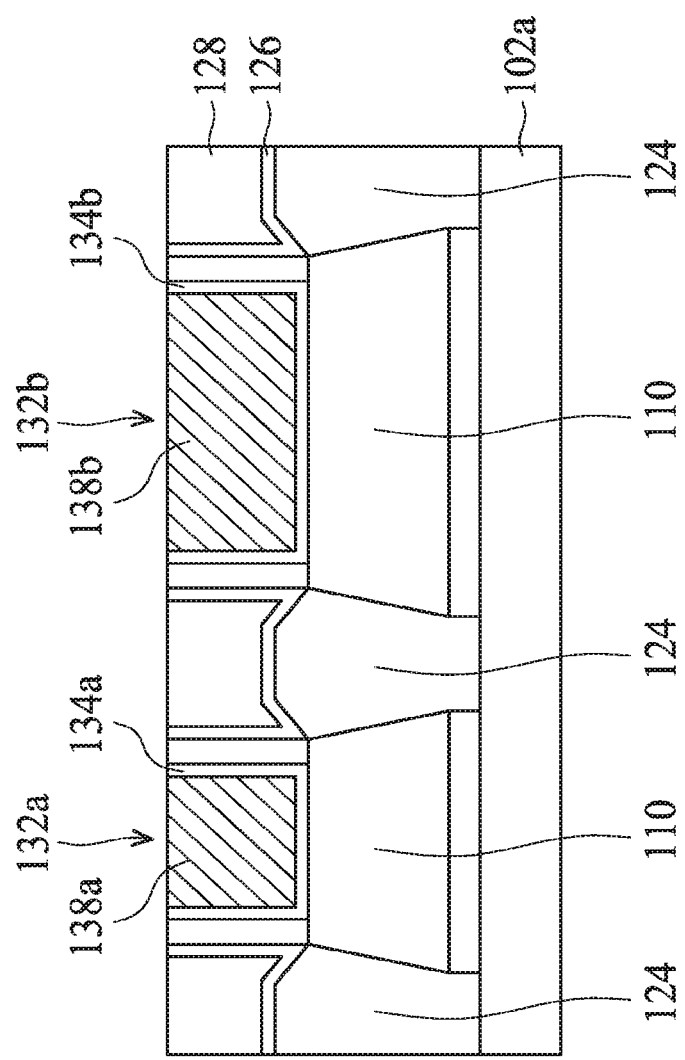
FIG. 10B shows a cross-sectional representation of the FinFET device structure taken along line II' of FIG. 10A, in accordance with some embodiments.

FIG. 10A is a perspective view of a semiconductor structure 100I in accordance with some embodiments. FIG. 10B shows a cross-sectional representation of the FinFET device structure taken along line II' of FIG. 10A, in accordance with some embodiments.

As shown in FIG. 10A, the bottom surface of the stop layer 103 is located at a position that is level with the top surface of the isolation structure 114.

As shown in FIG. 10B, the bottom surface of the S/D structure 124 is located a position that is level with the bottom surface of the stop layer 103.

Embodiments for a FinFET device structure and a method for formation of the same are provided. A FinFET device structure includes a stop layer over a substrate, and a fin structure formed over the stop layer. A gate structure is formed over the fin structure, and a S/D structure formed in a recess adjacent to the gate structure. The etching profile of a recess is controlled by using the stop layer. The surface proximity is reduced by forming the stop layer. Therefore, the performance and reliability of the FinFET device structure is improved.

In some embodiments, a FinFET device structure is provided. The FinFET device structure includes a stop layer formed over a substrate and a fin structure formed over the stop layer. The FinFET device structure includes a gate structure formed over the fin structure and a source/drain (S/D) structure adjacent to the gate structure. A bottom surface of the S/D structure is located at a position that is higher than or level with a bottom surface of the stop layer.

In some embodiments, a FinFET device structure is provided. The FinFET device structure includes a stop layer formed over a substrate and an isolation structure formed over the substrate. A top surface of the stop layer is located at a position that is higher than, level with or lower than a top surface of the isolation structure. The FinFET device structure includes a fin structure formed over the stop layer and a gate structure formed over the fin structure. The FinFET device structure further includes a source/drain (S/D) structure adjacent to the gate structure.

In some embodiments, a method for forming a semiconductor device structure is provided. The method includes forming a stop layer over a substrate and forming a fin structure over the stop layer. The method also includes forming an isolation structure over the substrate. The isolation structure is adjacent to the stop layer. The method includes forming a dummy gate structure over the fin structure and removing a portion of the fin structure to form a recess over the substrate. The recess is adjacent to the dummy gate structure. The method further includes forming a source/drain (S/D) structure in the recess, and the S/D structure is located at a position that is higher than or level with a bottom surface of the stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
    forming a stop layer over a substrate, wherein forming the stop layer includes forming one of SiOx or SiPOx;
    after forming the stop layer, forming a portion of a fin structure over the stop layer;
    forming an isolation structure over the substrate, wherein the isolation structure is adjacent to the stop layer;
    forming a dummy gate structure over the fin structure;

etching a portion of the fin structure to form a recess over the substrate, wherein the recess is adjacent to the dummy gate structure, wherein the etching process depth is controlled by selectivity to the stop layer; and forming a source/drain (S/D) structure in the recess, wherein the S/D structure is located at a position that is higher than or level with a bottom surface of the stop layer.

2. The method for forming the fin field effect transistor (FinFET) device structure as claimed in claim 1, wherein forming the stop layer over the substrate comprises:
providing the substrate; and
performing an ion implant process or a deposition process over the substrate to form the stop layer.

3. The method for forming the fin field effect transistor (FinFET) device structure as claimed in claim 1, further comprising:
forming an inter-layer dielectric (ILD) structure over the substrate and adjacent to the dummy gate structure;
removing the dummy gate structure to form a trench in the ILD structure; and
filling a gate structure in the trench.

4. The method for forming the fin field effect transistor (FinFET) device structure as claimed in claim 1, wherein forming the isolation structure over the substrate comprises:
forming an isolation material over the fin structure and the substrate;
etching a portion of the isolation material to expose a top surface of the fin structure and to form the isolation structure, wherein a top surface of the stop layer is located at a position that is higher than, level with or lower than a top surface of the isolation structure.

5. The method for forming the fin field effect transistor (FinFET) device structure as claimed in claim 1, wherein the etching the portion of the fin structure to form the recess includes the etching stopping at a top surface of the stop layer.

6. The method for forming the fin field effect transistor (FinFET) device structure as claimed in claim 5, wherein the forming the source/drain (S/D) structure in the recess includes forming the S/D structure directly interfacing the exposed top surface of the stop layer.

7. The method for forming the fin field effect transistor (FinFET) device structure as claimed in claim 1, wherein the forming the fin structure over the stop layer includes:
forming a patterned masking layer over the substrate, the stop layer, and a silicon layer over the stop layer; and
etching the stop layer and the silicon layer while using the patterned masking layer to form the fin structure of the silicon layer.

8. The method for forming the fin field effect transistor (FinFET) device structure as claimed in claim 7, wherein the etching the stop layer and the silicon layer further includes etching the substrate.

9. The method of claim 1, wherein forming the stop layer includes SiOx.

10. The method of claim 1, wherein forming the stop layer includes SiPOx.

11. A method for forming a fin field effect transistor (FinFET) device structure, comprising:
forming a stop layer over a silicon substrate, wherein forming the stop layer includes forming at least one of SiOx or SiPOx;
forming another silicon substrate over the stop layer;
etching the another silicon substrate, the stop layer, and the silicon substrate to form a fin structure;
forming an isolation structure over the silicon substrate, wherein the isolation structure is adjacent to the stop layer;
forming a gate structure over the fin structure;
removing a portion of the fin structure comprising the another silicon substrate to form a recess adjacent to the gate structure, wherein the recess exposes a top surface of a portion of the stop layer of the fin structure, wherein the exposed top surface is parallel a top surface of the isolation structure; and
forming a source/drain (S/D) structure in the recess.

12. The method of claim 11, wherein forming the stop layer includes SiOx.

13. The method of claim 12, wherein forming the stop layer includes SiPOx.

14. The method of claim 12, wherein the removing the portion of the fin structure comprises etching a first portion of the stop layer, wherein after the removing a second portion of the stop layer is the exposed portion of the stop layer; and
wherein the forming the S/D structure includes forming the S/D structure on the second portion of the stop layer.

15. The method of claim 12, wherein the forming the S/D structure in the recess includes forming the S/D structure to interface the stop layer.

16. A method for forming a fin field effect transistor (FinFET) device structure, comprising:
forming a fin structure, wherein the forming the fin structure includes:
providing a first semiconductor region,
depositing a stop layer over the first semiconductor region, wherein the stop layer includes a material consisting of one of SiOx, SiPOx, or SiGeOx,
depositing a second semiconductor region over the stop layer, and
patterning the first semiconductor region, the deposited stop layer, and the deposited second semiconductor region to form a fin-shape;
forming a gate structure over a channel region of the fin structure;
recessing the fin structure in a source region and a drain region of the fin structure while the gate structure is over the channel region, wherein the recessing includes etching using the stop layer as an etch stop and exposes a portion of the stop layer; and
forming a source/drain (S/D) structure in the recess in the source region and the recess in the drain region, wherein the stop layer interfaces the S/D structure.

17. The method of claim 16, wherein the recessing includes etching the second semiconductor region to expose an uppermost surface of the stop layer.

18. The method of claim 17, wherein the forming the S/D structure includes forming the S/D structure directly on the uppermost surface of the stop layer.

19. The method of claim 16, after the forming the S/D structure, the stop layer is disposed under the gate structure.

20. The method of claim 16, further comprising:
forming an isolation structure abutting the fin structure, wherein the isolation structure interfaces the stop layer.

* * * * *